(12) United States Patent
Nakagawa et al.

(10) Patent No.: US 7,273,820 B2
(45) Date of Patent: Sep. 25, 2007

(54) METHOD FOR FABRICATING SEMICONDUCTOR DEVICE

(75) Inventors: Hideo Nakagawa, Omihachiman (JP); Masaru Sasago, Hirakata (JP); Masayuki Endo, Izumi (JP); Yoshihiko Hirai, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 198 days.

(21) Appl. No.: 10/399,755

(22) PCT Filed: Oct. 9, 2001

(86) PCT No.: PCT/JP01/08840

§ 371 (c)(1),
(2), (4) Date: Apr. 22, 2003

(87) PCT Pub. No.: WO02/41381

PCT Pub. Date: May 23, 2002

(65) Prior Publication Data

US 2004/0029363 A1 Feb. 12, 2004

(30) Foreign Application Priority Data

Nov. 17, 2000 (JP) ........................................ 2000-350934

(51) Int. Cl.
*H01L 21/469* (2006.01)

(52) U.S. Cl. ............................................. 438/778
(58) Field of Classification Search ................ 438/778, 438/781–782, 758
See application file for complete search history.

(56) References Cited

U.S. PATENT DOCUMENTS

| | | | |
|---|---|---|---|
| 5,254,143 A | * 10/1993 | Anazawa et al. ............... | 95/46 |
| 5,434,107 A | 7/1995 | Paranjpe | |
| 5,679,610 A | 10/1997 | Matsuda et al. | |
| 6,091,481 A | * 7/2000 | Mori ............................ | 355/67 |
| 6,124,215 A | 9/2000 | Zheng | |

FOREIGN PATENT DOCUMENTS

| | | |
|---|---|---|
| EP | 0 683 511 A2 | 11/1995 |
| EP | 0 862 202 A1 | 9/1998 |
| EP | 0 928 638 A2 | 7/1999 |
| JP | 62 045045 | 2/1987 |
| JP | 07-147393 A | 6/1995 |
| JP | 09-213791 A | 8/1997 |
| JP | 10-32198 | 2/1998 |
| JP | 10-85641 A | 4/1998 |
| JP | 10-149964 | 6/1998 |
| JP | 10-247647 A | 9/1998 |
| JP | 10-90675 | * 10/1998 |
| JP | 11-274297 A | 10/1999 |
| JP | 2000-294627 | 10/2000 |
| WO | WO 01/18860 A2 | 3/2001 |

OTHER PUBLICATIONS

Doane, J. William. "Liquid Crystal Materials." Japanese Technology Evaluation Center: 1992, p. 2. Available http://www.wtec.org/loyola/dsply_jp/c2_s2.htm.*

Machine translation of Japanese Publication No. 10–090675.*

Koyama, Kazuhide. Japanese Patent Abstract JP411330235A "Method and Device for Working Insulating Layer of Semiconductor Device" (abstract only) Nov. 30, 1999.*

J.P. Han, et al., "$SrBi_2Te_2O_9$(SBT) Thin Films Prepared by Electrostatic Spray", New York, NY, vol. 14, No. 1/4, 1997, pp. 229–235, (XP–002036525).

* cited by examiner

*Primary Examiner*—Carl Whitehead, Jr.
*Assistant Examiner*—Colleen E. Rodgers
(74) *Attorney, Agent, or Firm*—McDermott Will & Emery LLP

(57) ABSTRACT

After a fluid film is formed by supplying a material with fluidity to the surface of a substrate formed with a stepped layer, the fluid film is pressed against the substrate by a pressing member having a planar pressing surface so that the surface of the fluid film is planarized. The fluid film is heated in this state and thereby solidified to form a solidified film having a planar surface.

50 Claims, 20 Drawing Sheets

METHOD FOR FABRICATING SEMICONDUCTOR DEVICE

TECHNICAL FIELD

The present invention relates to a method for fabricating a semiconductor device and, particularly, to a method for forming a film with a planar surface on a substrate.

BACKGROUND ART

In recent years, semiconductor devices have been fabricated by defining feature sizes as small as around 100 nm or less through miniaturization using lithographic technology which employs, as exposing light, a beam at a wavelength of about 100 nm or less.

In such lithographic technology using short-wavelength light, a focal depth is extremely lowered so that it is inevitable to constantly keep planar a surface of a film formed on a substrate. In fabricating a next-generation semiconductor device (100 nm or less in feature size), therefore, the technology for planarizing the film on the substrate is significantly important. In the present specification, a substrate is defined as a substrate on which a semiconductor device is formed such as a semiconductor substrate, a liquid crystal substrate (LCD), or the like.

At present, CMP (Chemical Mechanical Polishing) is main-stream technology for planarizing a film in a device ranging in size from 0.13 μm to 0.25 μm. There has also been proposed a method for forming a planar film (planarized film) by laminating two films that have been formed preliminarily.

The description of the former CMP technology will be omitted since it has been well known. Instead, a description will be given herein below to a method for forming a planar film by laminating two films disclosed in, e.g., Japanese Laid-Open Patent Publication No. HEI 10-32198.

First, as shown in FIG. 20(a), a semiconductor device is constructed on a substrate 101 through a microfabrication process performed with respect thereto so that a stepped layer 102 is formed. Hereinafter, the substrate 101 formed with the stepped layer 102 will be termed a stepped substrate (101, 102).

Then, a plate 104 to which a film 103 formed as a sheet has been adhered preliminarily is disposed such that the sheet-like film 103 and the stepped layer 102 are opposed to each other.

Next, as shown in FIG. 20(b), the plate 104 formed with the sheet-like film 103 and the stepped substrate (101, 102) are brought closer to each other and pressed against each other with the application of heat.

Next, as shown in FIG. 20(c), only the plate 104 is peeled off, while the sheet-like film 103 is left on the stepped substrate (101, 102).

As a result, the sheet-like film 103 with a planar surface is formed on the stepped substrate (101, 102), as shown in FIG. 20(d). In FIG. 20(d), 105 denotes an unburied portion resulting from a depressed portion with a high aspect ratio formed between interconnect patterns which has remained unfilled.

However, the conventional method for fabricating a semiconductor device has the problem that a global step (a difference in height from the substrate surface between locations at a distance), e.g., a step between the points A and B in FIG. 20(d) occurs, though a step in a dense pattern portion adjacent the point A is removed and the film 103 can be planarized.

If the spacing between the interconnect patterns, i.e., the spacing between step patterns is 100 nm or less, the aspect ratio of a depressed portion formed between the step patterns is increased so that the depressed portion is not filled consistently.

Although the use of the CMP technology prevents the occurrence of the problem that a depressed portion with a high aspect ratio remains unfilled, the essential problem that the global step cannot be suppressed remains unsolved.

DISCLOSURE OF THE INVENTION

In view of the foregoing, it is therefore an object of the present invention to allow the formation of a film without a global step, having a planar surface across the entire substrate, and capable of consistently filling a depressed portion with a high aspect ratio.

To attain the object, a first method for fabricating a semiconductor device according to the present invention comprises: a film forming step of supplying a material with fluidity to a surface of a substrate to form a film with fluidity; a planarizing step of pressing the film with fluidity against the substrate by a planar pressing surface of a pressing member to planarize a surface of the film with fluidity; and a soldifying step of solidifying the film with fluidity having the surface planarized.

Since the first method for fabricating a semiconductor device forms the film with fluidity (fluid film) on the surface of the substrate, planarizes the fluid film by pressing the fluid film by the planar pressing surface of the pressing member, and solidifies the fluid film having the planarized surface, a global step does not occur and a depressed portion with a high aspect ratio is filled completely so that an unburied portion is not formed.

In the first method for fabricating a semiconductor device, the pressing surface of the pressing member preferably has a hydrophobic property.

The arrangement allows easy removal of the pressing member from the solidified film so that a planar film with a smaller number of defects is formed.

In the first method for fabricating a semiconductor device, the material with fluidity is preferably an insulating material.

The arrangement enables the formation of an insulating film without a global step.

In the first method for fabricating a semiconductor device, the material with fluidity is preferably in the state of a liquid or a gel.

The arrangement enables easy and reliable formation of the film with fluidity on the surface of the substrate.

In the first method for fabricating a semiconductor device, the film forming step is preferably performed while the substrate is rotated.

The arrangement allows the material with fluidity to be filled even in an inner part of a depressed portion with a high aspect ratio.

In the first method for fabricating a semiconductor device, the film forming step preferably includes the step of rotating the substrate supplied with the material with fluidity.

The arrangement allows the material with fluidity to be filled even in an inner part of a depressed portion with a high aspect ratio.

In the first method for fabricating a semiconductor device, the film forming step is preferably performed by supplying the material with fluidity in a showering or spraying manner while rotating the substrate.

The arrangement enables the formation of the film with fluidity having a relatively small thickness.

In the first method for fabricating a semiconductor device, the film forming step is preferably performed by supplying, while moving a nozzle having fine outlets and the substrate relative to each other in an in-plane direction, the material with fluidity from the outlets to the surface of the substrate.

In the arrangement, the thickness of the film with fluidity can be controlled to a desired value by adjusting the relative moving speeds of the nozzle and the substrate. By adjusting the viscosity of the material with fluidity, the degree of fluidity of the film with fluidity can also be changed. By adjusting the number of nozzles, the processing speed can also be controlled.

In the first method for fabricating a semiconductor device, the film forming step is preferably performed by supplying, to the surface of the substrate, the material with fluidity adhered to a surface of a roller, while rotating the roller.

In the arrangement, the thickness of the film with fluidity can be controlled by adjusting the distance between the roller and the substrate and the force with which the roller is pressed against the substrate. In addition, a material with fluidity having a high viscosity can be used.

Preferably, the first method for fabricating a semiconductor device further comprises, after the film forming step, the step of: selectively removing a peripheral portion of the film with fluidity.

The arrangement facilitates the mechanical holding of the peripheral portion of the substrate in the process of fabricating a semiconductor device.

In this case, the step of removing the peripheral portion of the film with fluidity is preferably performed by supplying a solution for dissolving the material with fluidity to the peripheral portion of the film with fluidity, while rotating the substrate.

The arrangement ensures the removal of the peripheral portion of the substrate having a plan configuration which is a circle or a polygon with a large number of angles.

In this case, the step of removing the peripheral portion of the film with fluidity is also preferably performed by irradiating the peripheral portion of the film with fluidity with light to modify the peripheral portion and removing the modified peripheral portion.

The arrangement ensures the removal of the peripheral portion of the substrate having a plan configuration which is not only a circle or a polygon with a large number of angles but also a polygon having a small number of angles, such as a triangle or quadrilateral.

In the first method for fabricating a semiconductor device, the planarizing step preferably includes the step of measuring a plurality of distances between the surface of the substrate and the pressing surface and pressing the film with fluidity by the pressing surface such that the plurality of distances become equal.

The arrangement allows the distance from the substrate surface to the surface of the film with fluidity to be held constantly equal and obviates the necessity to perform the operation of adjusting the distance between the surface of the substrate and the pressing surface of the pressing member to be equal every specified period.

In the first method for fabricating a semiconductor device, the planarizing step preferably includes the step of measuring a plurality of distances between a surface of a stage on which the substrate is placed and the pressing surface and pressing the film with fluidity by the pressing surface such that the plurality of distances become equal.

The arrangement allows the distance from the substrate surface to the surface of the film with fluidity to be held constantly equal and obviates the necessity to perform the operation of adjusting the distance between the surface of the substrate and the pressing surface of the pressing member to be equal every specified period.

In these cases, the step of measuring the plurality of distances is preferably performed by measuring an electrostatic capacitance per unit area at a position at which the measurement is performed.

The arrangement enables easy and reliable measurement of the plurality of distances.

In the first method for fabricating a semiconductor device, the solidifying step is preferably performed by heating the film with fluidity, while pressing the film with fluidity by the pressing surface in the planarizing step.

The arrangement allows easy solidification of the film with fluidity by a thermochemical reaction.

In the first method for fabricating a semiconductor device, the solidifying step is preferably performed by irradiating the film with fluidity with light, while pressing the film with fluidity by the pressing surface in the planarizing step.

The arrangement allows easy solidification of the film with fluidity by a photochemical reaction or a thermochemical reaction.

In this case, the step of irradiating the film with fluidity with light is preferably performed while cooling the film with fluidity or after temporarily solidifying the film with fluidity by cooling.

The arrangement ensures the solidification of the film with fluidity without impairing the planarity thereof even if the film has a high degree of fluidity.

In the first method for fabricating a semiconductor device, the solidifying step is preferably performed by irradiating the film with fluidity with light and heating the film with fluidity, while pressing the film with fluidity by the pressing surface in the planarizing step.

The arrangement allows rapid solidification of the film with fluidity by a photochemical reaction or a thermochemical reaction.

Preferably, the first method for fabricating a semiconductor device further comprises, after the solidifying step, the step of: thinning the entire film with fluidity.

The arrangement makes it possible to form the film with fluidity having a thickness larger than a desired value and then thin it to form the film with the desired thickness so that a stable process with a wide process window is implemented.

In this case, the step of thinning the entire film with fluidity is preferably performed by plasma etching.

The arrangement improves the accuracy of the thickness of the thinned film.

In this case, the step of thinning the film with fluidity is also preferably performed by chemical mechanical polishing.

The arrangement facilitates the step of thinning the film.

A second method for fabricating a semiconductor device according to the present invention comprises the steps of: supplying an insulating material with fluidity to a surface of a substrate to form an insulating film with fluidity; pressing the insulating film with fluidity against the substrate by a planar pressing surface of a pressing member to planarize a surface of the insulating film with fluidity; solidifying the insulating film with fluidity having the surface planarized;

performing selective etching with respect to the solidified insulating film to form a depressed portion in the solidified insulating film; and burying a metal material in the depressed portion to form a buried interconnect or plug.

Since the second method for fabricating a semiconductor device allows the formation of the insulating film without a global step, a reduction in focal depth margin resulting from a step can be suppressed in the step of forming a mask pattern on the insulating film by lithographic technology. This achieves a significant increase in processing margin (process window), compared with the prior art technology, so that a high-precision semiconductor device is fabricated.

In the second method for fabricating a semiconductor device, the insulating film is preferably an organic film, an inorganic film, an organic/inorganic hybrid film, a photoforming film, a photosensitive resin film, or a porous film.

The arrangement allows the formation of the insulating film having a compact texture and excellent planarity.

In the second method for fabricating a semiconductor device, a relative dielectric constant of the insulating film is preferably approximately 4 or less.

The arrangement achieves a reduction in wire-to-wire capacitance so that the performance of the semiconductor device is improved.

BEST MODE FOR CARRYING OUT THE INVENTION

Embodiment 1

A method for fabricating a semiconductor device according to a first embodiment will be described herein below with reference to FIGS. 1(a) to 1(c) and FIGS. 2(a) to 2(c).

Figure 1A:
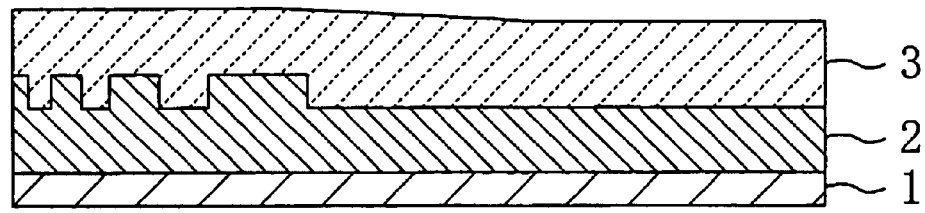
FIG. 1 is a cross-sectional view illustrating the individual process steps of a method for fabricating a semiconductor device according to a first embodiment.

First, as shown in FIG. 1(a), a material with fluidity such as a material in the state of a liquid or gel is supplied to a surface of a stepped substrate (1, 2) consisting of a substrate 1 composed of a semiconductor wafer and a stepped layer 2 to form a film 3 with fluidity (hereinafter simply referred to as the fluid film).

As examples of the fluid film, there can be listed an organic film, an inorganic film, an organic/inorganic composite film (organic/inorganic hybrid film), a photoforming film which is cured under the radiation of light, a photosensitive resist film such as a resist film, and a porous film having therein numerous pores ranging in diameter from several nanometers to about 10 nanometers.

As examples of a method for forming the fluid film 3, there can be listed a spin coating method, a microscopic spraying method, and a rotating roller method. The thickness of the fluid film 3 can be adjusted by selecting among the methods for forming the fluid film 3, though the adjustment of the thickness of the fluid film 3 differs from one method to another. The methods for forming the fluid film 3 will be described in detail in first to fourth examples.

The plan configuration of the substrate 1 is not particularly limited. The substrate 1 may have any configuration such as a circle or polygon.

In the case where the fluid film 3 is used as an interlayer film in multilayer interconnection, an insulating material is used preferably as the material with fluidity.

Figure 1B:
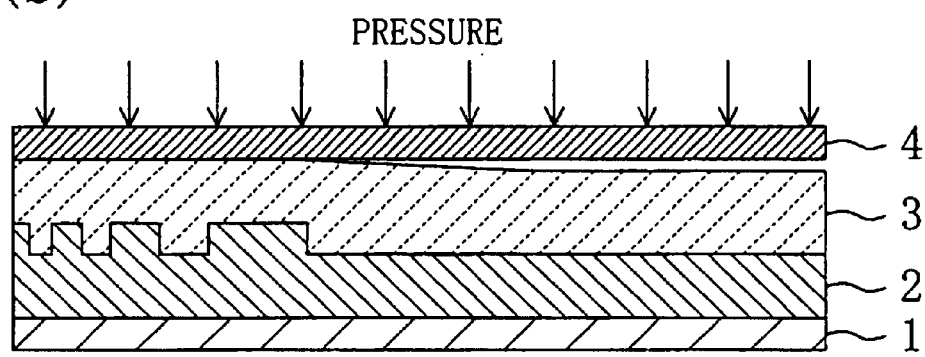
Figure 1C:
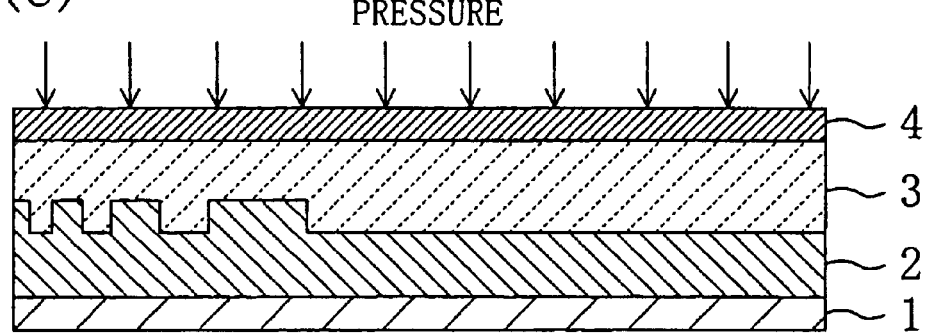

Next, as shown in FIG. 1(b), a pressing member 4 having a planar pressing surface is disposed such that the pressing surface thereof is opposed to the surface of the fluid film 3. Then, as shown in FIG. 1(c), a pressure in the direction of the substrate is applied to the pressing member 4 to press the fluid film 3 against the substrate 1 and thereby planarize the surface of the fluid film 3.

In this case, the surface of the fluid film 3 is planarized over the entire surface of the substrate 1 by merely pressing it by the pressing surface of the pressing member 4. If the pressing operation performed by the pressing member 4 is interrupted, however, the fluid film 3 is transformed into a configuration which is stable in terms of energy by the surface tension of the fluid film 3.

To prevent this, the fluid film 3 is heated while it is pressed by the pressing member 4 against the substrate 1 so that a chemical reaction occurs within the fluid film 3 and the fluid film 3 is solidified. Consequently, a solidified film with a planar surface (hereinafter simply referred to as the solidified film) 5 is formed.

Then, the heating is completed and the temperature of the solidified film 5 is reduced to a room temperature. If the pressing member 4 is removed from the solidified film 5 thereafter, as shown in FIG. 2(b), the solidified film 5 with a planar surface can be formed on the surface of the stepped substrate (1, 2), as shown in FIG. 2(c).

Preferably, a Teflon coating treatment or a surface treatment using a silicon coupling material is performed with respect to the pressing surface such that the planar pressing surface of the pressing member 4 has a hydrophobic property. This facilitates the removal of the pressing member 4 from the solidified film 5 so that a planar solidified film 5 with a smaller number of defects is formed.

Figure 3A:
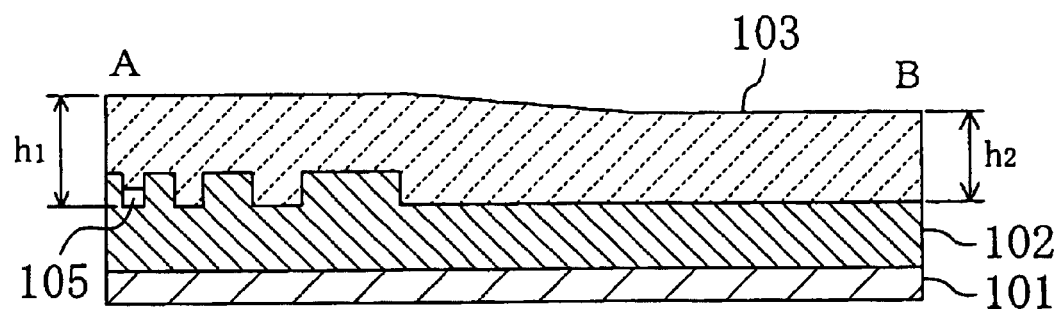
FIG. 3(a) is a cross-sectional view showing a sheet-like film obtained by a conventional method for fabricating a semiconductor device and FIG. 3(b) is a cross-sectional view showing a solidified film obtained by the method for fabricating a semiconductor device according to the first embodiment.
Figure 3B:
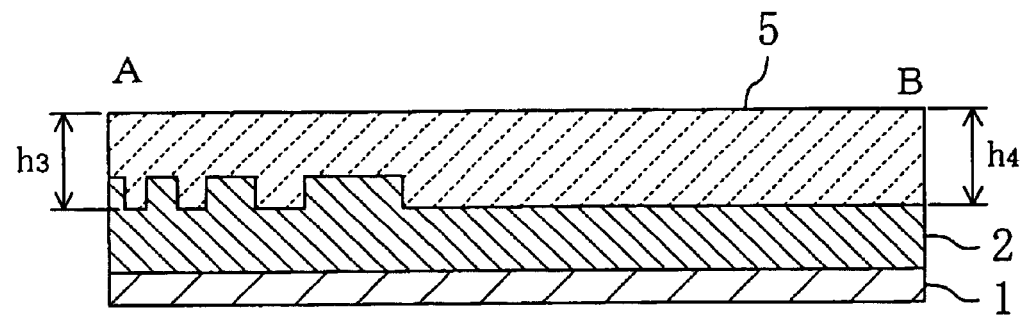

FIG. 3(a) shows a cross-sectional configuration of the sheet-like film 103 with a planar surface obtained by the conventional method for fabricating a semiconductor device. FIG. 3(b) shows the cross-sectional configuration of the solidified film 5 with a planar surface obtained by the method for fabricating a semiconductor device according to the first embodiment.

In the sheet-like film 103 obtained by the conventional method, the relationship represented by $h_1 > h_2$ exists between a film thickness $h_1$ at the point A and a film thickness $h_2$ at the point B. This is because the conventional method has pressed the sheet-like film 103 adhered to the plate 104 against the stepped substrate (101, 102) with the application of heat and then peeled the plate 104 off. As a result, not only a global step ($h_2 - h_1$) occurs but also the unburied portion 105 occurs since a depressed portion with a high aspect ratio remains unfilled.

In the solidified film 5 obtained according to the first embodiment, by contrast, the relationship represented by $h_3 = h_4$ exists between a film thickness $h_3$ at the point A and a film thickness $h_4$ at the point B. This is because the first embodiment has formed the fluid film 3 by supplying the material with fluidity to the surface of the stepped substrate (1, 2), planarized the surface of the fluid film 3, and then solidified the fluid film 3 to provide the solidified film 5. As a result, a global step does not occur and an unburied portion is not formed since a depressed portion with a high aspect ratio is filled completely.

A description will be given herein below to the material with fluidity.

As an example of the material with fluidity for forming an organic film, there can be listed an aromatic polymer containing aryl ether as a main skeleton and, specifically, FLARE (commercially available from Honeywell Corporation) and SiLK (commercially available from Dow Chemical Co.) can be listed.

As an example of the material with fluidity for forming an inorganic film, there can be listed HSQ (Hydrogen Silsquioxane) or an organic SOG such as an alkylsiloxane polymer can be listed. As a specific example of the HSQ, Fox (commercially available from Dow Corning Corporation) can be listed. As a specific example of the organic SOG, HSG-RZ25 (commercially available from Hitachi Chemical Co., Ltd.) can be listed.

As an example of the material with fluidity for forming an organic/inorganic hybrid film, there can be listed organic siloxane containing an organic group such as a methyl group in a siloxane skeleton. As a specific example, there can be listed HOSP (Hybrid Organic Siloxane Polymer commercially available from Honeywell Corporation).

As an example of the material with fluidity for forming a photoforming film, there can be listed PDGI (Poly Dimethyl Glutar Imide) can be listed. As a specific example, SAL101 (commercially available from Shipley Far East Ltd.) can be listed.

As an example of the material with fluidity for forming a photosensitive resin film, there can be used a typical resist material used for lithographic technology.

As an example of the material with fluidity for forming a porous film, there can be listed an organic or inorganic material or an organic/inorganic hybrid material. As a specific example of the organic material with pores, FLAIRE (commercially available from Honeywell Corporation) can be listed. As a specific example of the inorganic material with pores, KLK (commercially available from Dow Corning Corporation) having pores in HSQ (Hydrogen Silsquioxane) can be listed. As an example of the organic/inorganic hybrid material with pores, Nanoglass (commercially available from Honeywell Corporation) can be listed.

If the solidified film 5 obtained by solidifying the fluid film 3 formed by using any of the foregoing materials is used as an interlayer insulating film in multilayer interconnection, an interlayer insulating film having a compact texture and a dielectric constant lower than that of a normal silicon oxide film (having a relative dielectric constant of about 4) is obtainable so that a film suitable for use in a semiconductor device formed through microfabrication for defining a feature size of 100 nm or less is implemented. If a porous film is used, in particular, an interlayer insulating film having an extremely low dielectric constant of 2 or less can be formed.

Although the foregoing materials are for forming insulating films, the present invention is not limited to the formation of the insulating films and can also be used as a method for forming a conductive polymer film or metal film.

Example 1

A description will be given herein below to a method for forming a fluid film according to a first example, i.e., to a first spin coating method with reference to FIGS. 4A(a) to 4(d).

Figure 4A:
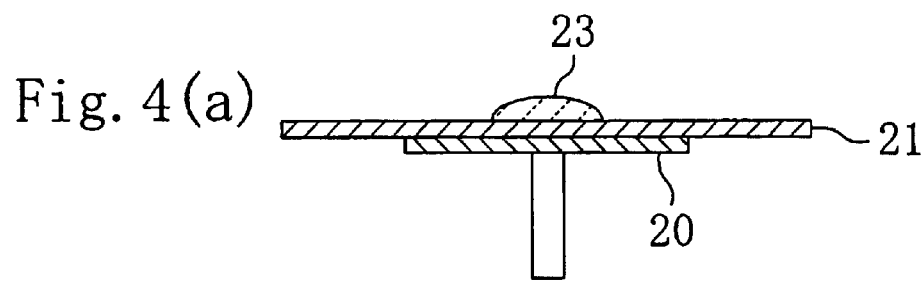
FIGS. 4(a) to 4(d) are cross-sectional views illustrating the individual process steps of a first example of the first embodiment.

First, as shown in FIG. 4(a), a stepped substrate 21 is carried by vacuum suction on a stage 20 provided rotatable, a proper amount of material 23 with fluidity is supplied dropwise onto the stepped substrate 21, and then the stage 20 is rotated. Or alternatively, the stepped substrate 21 is carried by vacuum suction on the stage 20 provided rotatable and then a material with fluidity is supplied onto the stepped substrate 21 from a drop nozzle 24, while the stage 20 and the stepped substrate 21 are rotated, as shown in FIG. 4(b).

Figure 4B:
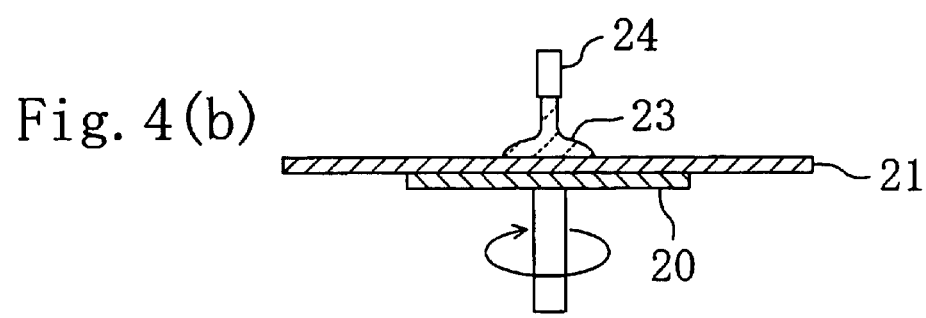
Figure 4C:
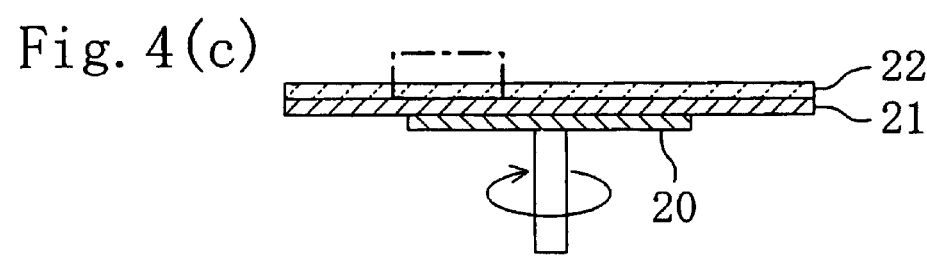
Figure 4D:
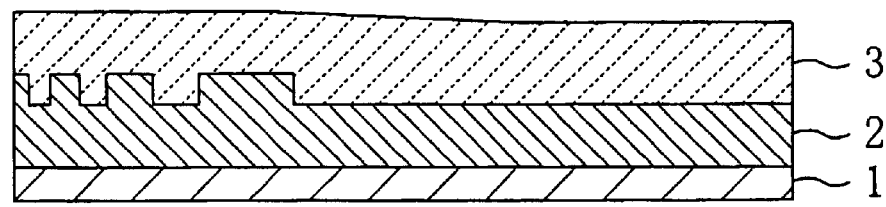

As a result, a fluid film 22 with a planar surface is formed on the stepped substrate 21, as shown in FIG. 4(c). FIG. 4(d)

shows the portion enclosed by the dash-dot lines in FIG. 4(c), in which the fluid film 3 having a planar surface is formed on the stepped layer 2 formed on the substrate 1.

In either of the case where the method shown in FIG. 4(a) is used and the case where the method shown in FIG. 4(b) is used, the fluid film 22(3) having a hardness suitable for the step of planarizing the surface of the fluid film 22(3) by the foregoing pressing member 4 is obtainable by optimizing the viscosity of the material 23 with fluidity and the rotating speed of the stage 20.

The first example is suitable for the case where the fluid film 22(3) having a relatively large thickness is formed.

Example 2

A description will be given herein below to a method for forming a fluid film according to a second example, i.e., to a second spin coating method with reference to FIGS. 5(a) to 5(c).

Figure 5A:
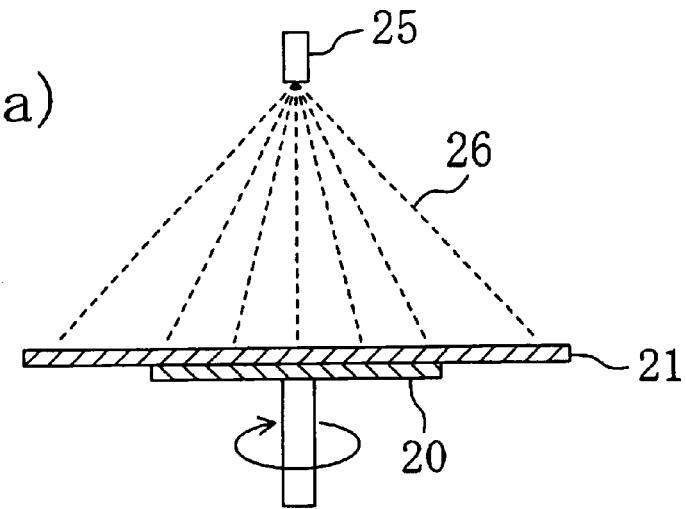
FIGS. 5(a) to 5(c) are cross-sectional views illustrating the individual process steps of a second example of the first embodiment.

First, as shown in FIG. 5(a), the stepped substrate 21 is carried by vacuum suction on the stage 20 provided rotatable. Then, a material 26 with fluidity is supplied in a showering or spraying manner from the outlets of an eject nozzle 25 onto the stepped substrate 21.

Figure 5B:
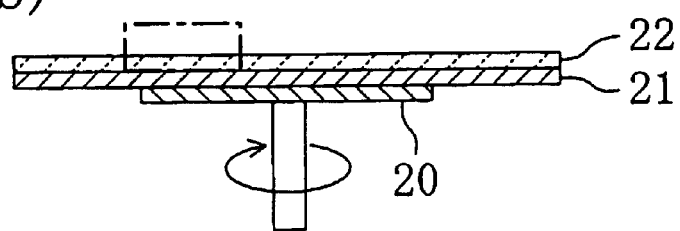
Figure 5C:
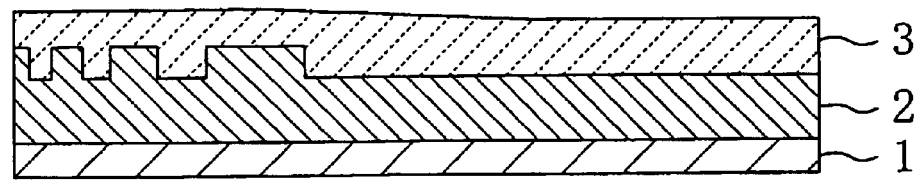

After the material 26 with fluidity is supplied in a specified amount, the stage 20 is rotated continuously for a specified time so that the fluid film 22 having a planar surface is formed on the stepped substrate 21, as shown in FIG. 5(b). FIG. 5(c) shows the portion enclosed by the dash-dot lines in FIG. 5(b), in which the fluid film 3 having a planar surface is formed on the stepped layer 2 formed on the substrate 1.

The second example is suitable for the case where the fluid film 22(3) having a relatively small thickness is formed.

Example 3

A description will be given herein below to a method for forming a fluid film according to a third example, i.e., to a microscopic spraying method with reference to FIGS. 6(a) to 6(c).

Figure 6A:
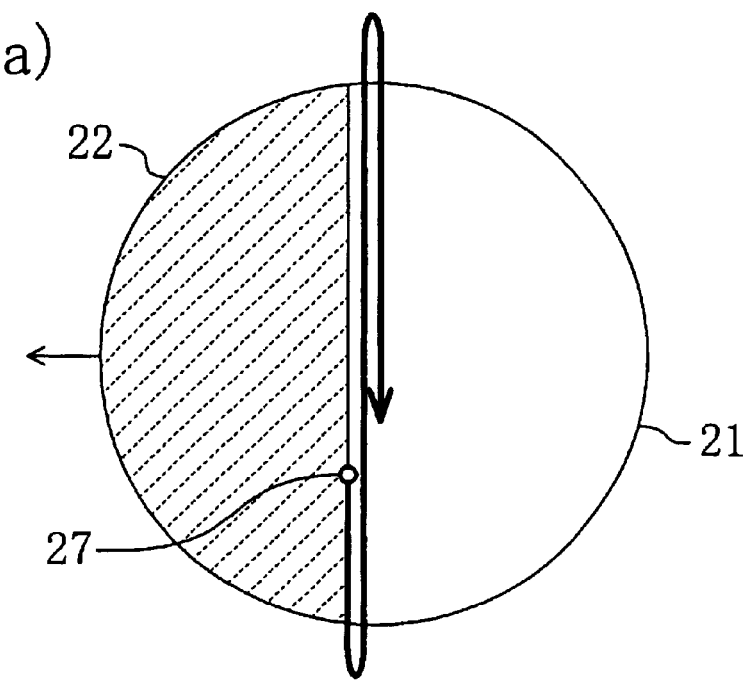
FIGS. 6(a) to 6(c) are cross-sectional views illustrating the individual process steps of a third example of the first embodiment

First, as shown in FIG. 6(a), a material 28 with fluidity is supplied stepwise in specified amounts from a drop nozzle 27 onto the stepped substrate 21, while the stepped substrate 21 is moved in one of two orthogonal directions in 2-D orthogonal coordinate systems, e.g., in the horizontal direction of FIG. 6(a) and the drop nozzle 27 is moved in the other of the two orthogonal directions, e.g., in the vertical direction of FIG. 6(a). Specifically, the operation of stopping the stepped substrate 21 that has moved over a specified distance in the leftward direction in FIG. 6(a) is performed repeatedly and the material with fluidity is supplied stepwise in specified amounts from the drop nozzle 27 onto the stepped substrate 21, while the drop nozzle 27 is moved in the upward or downward direction in FIG. 6(a) during a period during which the stepped substrate 21 is stopped.

Figure 6B:
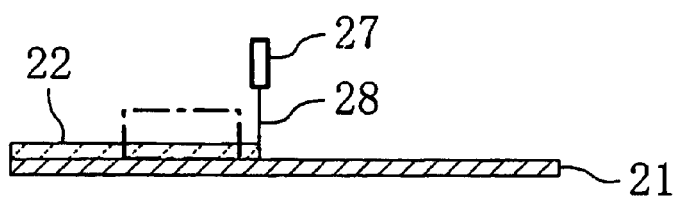
Figure 6C:
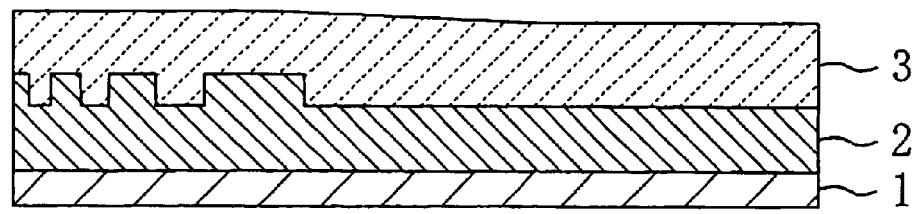

As a result, the fluid film 22 with a planar surface is formed on the stepped substrate 21, as shown in FIG. 6(b). FIG. 6(c) shows the portion enclosed by the dash-dot lines in FIG. 6(b), in which the fluid film 3 with a planar surface is formed on the stepped layer 2 formed on the substrate 1.

According to the third example, the thickness of the fluid film 22(3) can be controlled in a range from a small value to a large value by adjusting the amount of the material with fluidity supplied from the drop nozzle 27 and the moving speed of the drop nozzle 27.

Moreover, the degree of fluidity of the fluid film 22(3) can be changed by adjusting the viscosity of the material with fluidity supplied from the drop nozzle 27.

Furthermore, the processing speed can be controlled by adjusting the number of drop nozzles 27.

Example 4

A description will be given herein below to a method for forming a fluid film according to a fourth example, i.e., to a rotating roller method with reference to FIGS. 7(a) to 7(c).

Figure 7A:
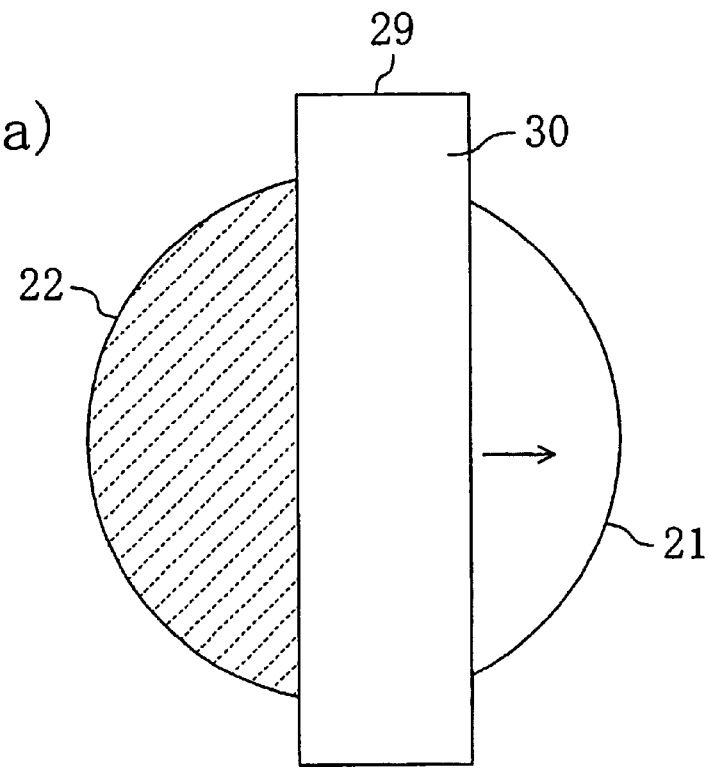
FIGS. 7(a) to 7(c) are cross-sectional views illustrating the individual process steps of a fourth example of the first embodiment.
Figure 7B:
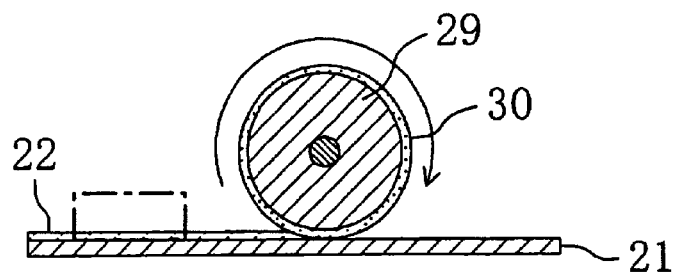
Figure 7C:
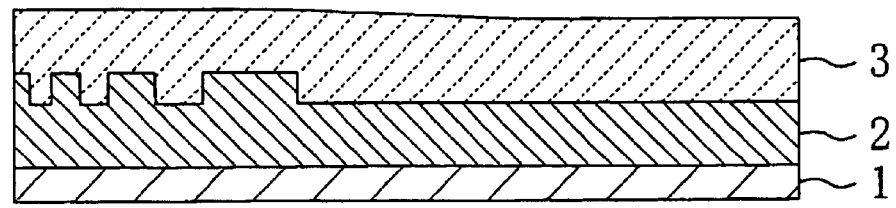

As shown in FIGS. 7(a) and 7(b), a rotating roller 29 is moved rotatively along the surface of the stepped substrate 2 with a material 30 with fluidity being evenly adhered to the circumferential surface of the rotating roller 29.

As a result, the material 30 with fluidity is transferred onto the surface of the stepped substrate 21 so that the fluid film 22 with a planar surface is formed on the stepped substrate 21. FIG. 7(c) shows the portion enclosed by the dash-dot lines in FIG. 7(b), in which the fluid film 3 with a planar surface is formed on the stepped layer 2 formed on the substrate 1.

According to the fourth example, the thickness of the fluid film 22(3) can be controlled by adjusting the distance between the rotating roller 29 and the stepped substrate 21 and the force with which the rotating roller 29 is pressed against the stepped substrate 21.

The fourth example is suitable for the case where the material 30 with fluidity is in the state of a highly viscous liquid or gel.

Embodiment 2

A method for fabricating a semiconductor device according to a second embodiment will be described herein below with reference to FIGS. 8(a) to 8(c) and FIGS. 9(a) to 9(c).

The second embodiment provides methods for selectively removing the peripheral portion of the fluid film obtained according to the first embodiment, of which the first one supplies a solution for dissolving the fluid film to the peripheral portion thereof, while rotating the substrate formed with the fluid film, and thereby removes the peripheral portion of the fluid film and the second one modifies the peripheral portion of the fluid film by irradiating it with light and then removes the modified peripheral portion.

The first embodiment has formed the fluid film 3 over the entire surface of the substrate 1, i.e., even on the peripheral portion of the substrate 1.

However, there are cases where the peripheral portion of the substrate 1 should be held mechanically.

The second embodiment has been achieved to solve such a problem. Since the second embodiment selectively removes the peripheral portion of the fluid film 3, it becomes easier to mechanically hold the peripheral portion of the substrate 1.

A description will be given herein below to the first method for selectively removing the peripheral portion of the fluid film 22 with reference to FIGS. 8(a) to 8(c).

Figure 8A:
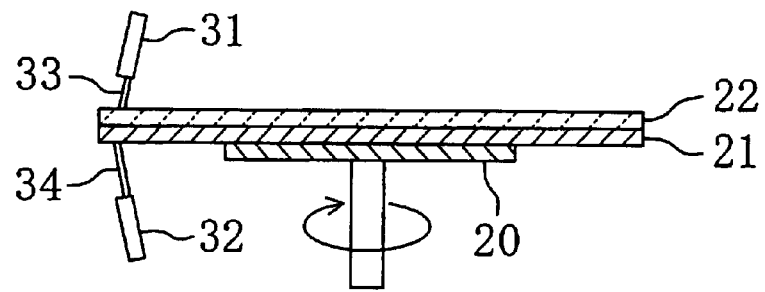
FIGS. 8(a) to 8(c) are cross-sectional views illustrating the individual process steps of a method for fabricating a semiconductor device according to a second embodiment.

First, as shown in FIG. 8(a), the stepped substrate 21 formed with the fluid film 22 is vacuum-sucked on the stage 20 provided rotatable. Then, the stage 20 is rotated to rotate the fluid film 22, while a release agent 33 is supplied from a first nozzle 31 to the peripheral portion of the fluid film 22 and a release agent 34 is supplied from a second nozzle 32 to the back surface of the peripheral portion of the stepped substrate 21.

Figure 8B:
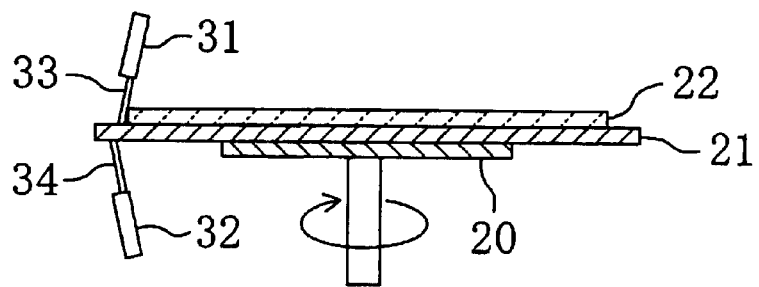
Figure 8C:
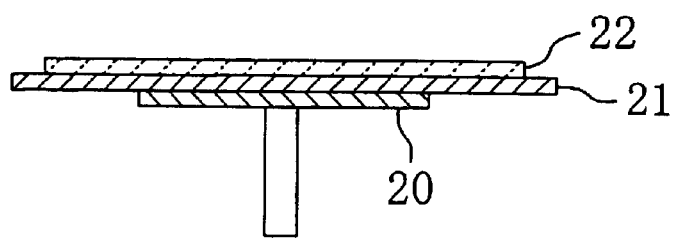

This allows the removal of the peripheral portion of the fluid film 22 and the removal of the material with fluidity adhered to the back-surface peripheral portion of the stepped substrate 21, as shown in FIG. 8(b).

The rotation of the stage 20 is performed continuously, while the supply of the release agents 33 and 34 is stopped, so that the fluid film 22 is dried.

Although the first method may be implement before or after the surface of the fluid film 22 is planarized, it is preferably implemented before the fluid film 22 is solidified.

Since the first method removes the peripheral portion of the fluid film 22, while rotating the stage 22 and the fluid film 22, it is suitable for the stepped substrate 21 having a plan configuration which is a circle or a polygon with a large number of angles.

A description will be given herein below to the second method for selectively removing the peripheral portion of the fluid film 22 with reference to FIGS. 9(a) to 9(c).

Figure 9A:
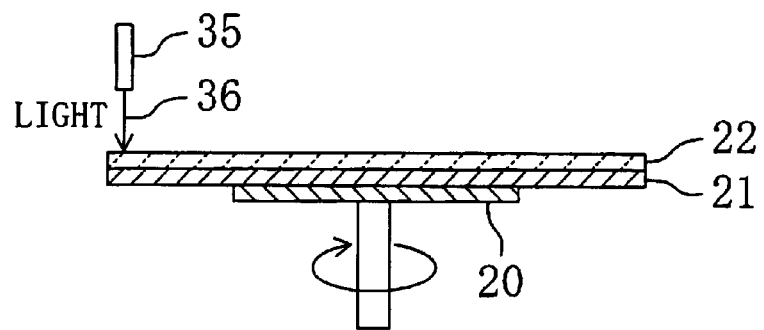
FIGS. 9(a) to 9(c) are cross-sectional views illustrating the individual process steps of the method for fabricating a semiconductor device according to the second embodiment.

First, as shown in FIG. 9(a), the stepped substrate 21 formed with the fluid film 22 is vacuum-sucked on the stage 20 provided rotatable. Then, the stage 20 is rotated to rotate the fluid film 22, while the peripheral portion of the fluid film 22 is irradiated with light 36 from an irradiating apparatus 35, so that a photochemical reaction is caused in the peripheral portion (portion irradiated with the light) of the fluid film 22 and the peripheral portion is modified. In this case, a UV beam or a beam at a wavelength shorter than that of the UV beam is used preferably as the light 36.

Figure 9B:
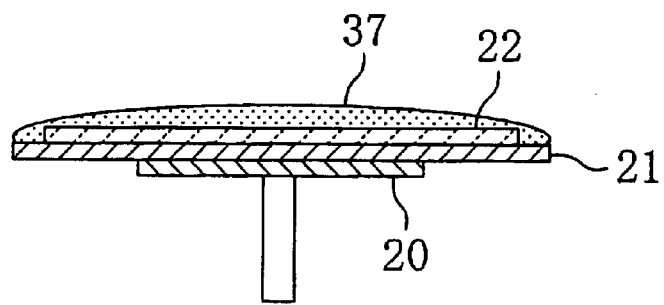

Next, as shown in FIG. 9(b), the rotation of the stage 20 and the rotation of the fluid film 22 are stopped and then a solution 37 such as a developing solution is supplied onto the entire surface of the fluid film 22. As a result, the modified peripheral portion of the fluid film 22 is dissolved in the solution 37 so that the peripheral portion of the fluid film 22 is removed selectively.

Figure 9C:
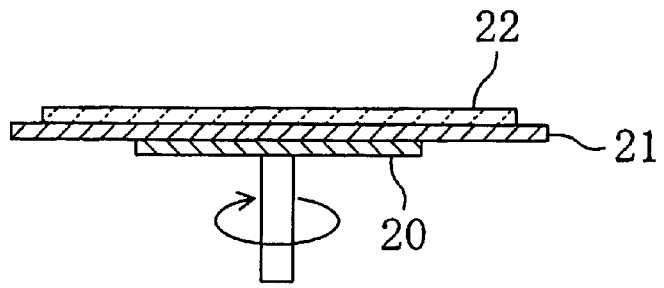

Next, as shown in FIG. 9(c), the stage 20 and the fluid film 22 are rotated again such that the solution 37 remaining on the fluid film 22 is removed by a centrifugal force to the outside. In this case, it is preferable to supply a rinsing agent onto the fluid film 22 while removing the solution 37 or after removing the solution 37 and thereby remove the solution 37. As a result, the fluid film 22 from which the peripheral portion has been removed selectively can be obtained.

Although the second method may be implemented before or after the surface of the fluid film 22 is planarized, it is performed preferably before the fluid film 22 is solidified.

Since the second method selectively irradiates the peripheral portion of the fluid film 22 with the light 36, it is applicable not only to the stepped substrate 21 having a plan configuration which is a circle or a polygon with a large number of angles but also to the stepped substrate 21 having a polygonal plan configuration with a small number of angles, such as a triangle or quadrilateral.

Embodiment 3

A method for fabricating a semiconductor device according to a third embodiment will be described herein below with reference to FIGS. 10(a) and 10(b) and FIGS. 11(a) and 11(b).

The third embodiment provides a method preferred to planarize the surface of the fluid film obtained according to the first embodiment, which measures a plurality of distances between the surface of the substrate or the surface of the stage and the pressing surface of the pressing member and presses the fluid film such that the plurality of distances become equal.

Figure 10A:
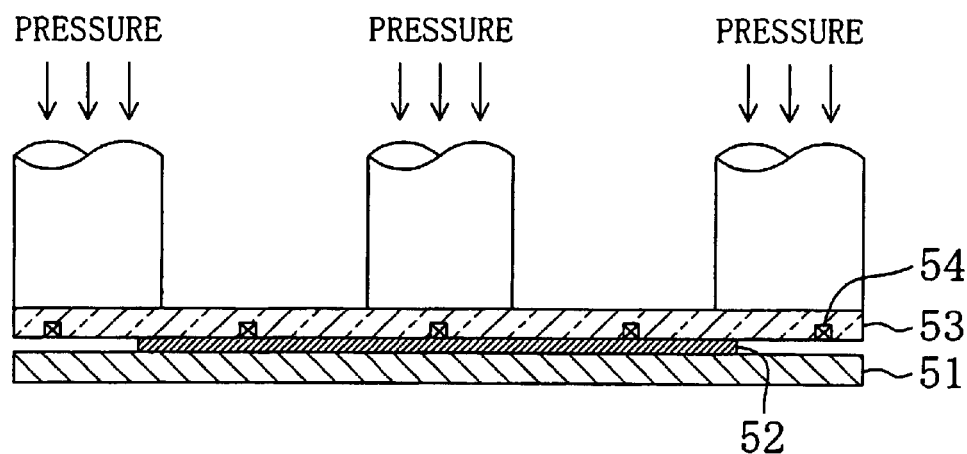
FIGS. 10(a) and 10(b) are cross-sectional views illustrating the individual process steps of a method for fabricating a semiconductor device according to a third embodiment.

First, as shown in FIG. 10(a), a fluid film 52 is formed on a substrate 51 by the method according to the first embodiment and then planarized by using a pressing member 53 having a plurality of distance sensors 54 on the pressing surface thereof. In this case, a plurality of distances between the surface of the substrate 51 or the surface of the stage 20 (see FIG. 4(c) or 5(b). In the third embodiment, the outer size of the stage 20 is adjusted preferably to be larger than that of the substrate 51) on which the substrate 51 is placed and the pressing surface of the pressing member 53 are measured by using the plurality of distance sensors 54, while the fluid film 52 is pressed by the pressing member 53 to be planarized such that the plurality of distances become equal. Data on the plurality of distances measured by using the plurality of distance sensors 54 is feedbacked to pressing means for pressing the pressing member 53 and the fluid film 52 is pressed such that the plurality of distances become equal. Feedback control may be performed appropriately by using a computer.

Figure 10B:
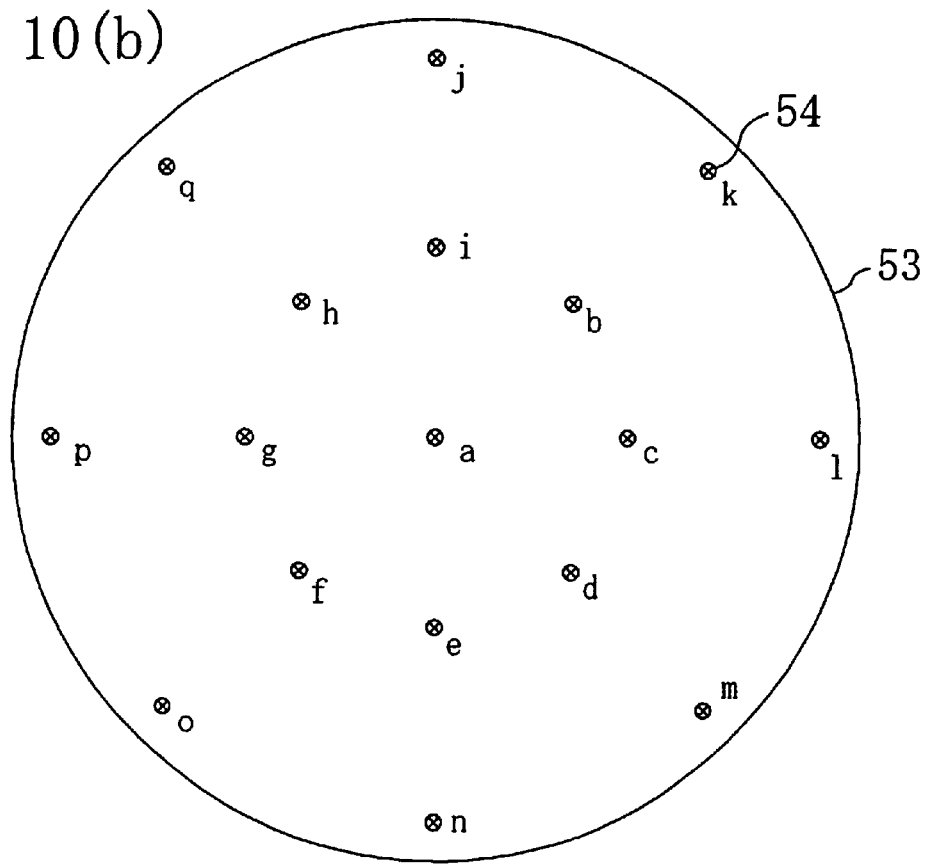

Referring to FIG. 10(b), a description will be given herein below to a method for measuring a plurality of distances between the surface of the substrate 51 and the pressing surface of the pressing member 53.

In FIG. 10(b), a, b, c . . . , and q denote positions at which the distance sensors 54 are disposed. The positions a to q of the distance sensors 54 are optimized preferably depending on the mechanism of the pressing member 53. The distance sensors 54 may be disposed appropriately at the positions which allow efficient measurement of the distances between the surface of the substrate 51 or the surface of the stage on which the substrate 51 is placed and the surface of the fluid film 52. For example, the positions a to i of the sensors are suitable for measuring the distances between the surface of the substrate 51 and the surface of the fluid film 52 and the positions j to q of the sensors are suitable for measuring the distances between the surface of the stage on which the substrate 51 is placed and the surface of the fluid film 52.

Accordingly, it is possible to measure only the distances between the surface of the substrate 51 and the surface of the fluid film 52 by using only the distance sensors 54 at the positions a to i, measure only the distances between the surface of the stage on which the substrate 51 is placed and the surface of the fluid film 52 by using only the distance sensors 54 at the positions j to q, or measure the distances between the surface of the substrate 51 and the surface of the fluid film 52 as well as the distances between the surface of the stage on which the substrate 51 is placed and the surface of the fluid film 52 by using the distance sensors 54 at the positions a to q.

If the roughness of the pressing surface of the pressing member 54 can be adjusted finely, it is also possible to adjust the distance between the surface of the substrate 51 and the surface of the fluid film 52 by using the distance sensors 54 at the positions a to i and then adjust the distance between the surface of the substrate 51 and the surface of the fluid film 52 by using the distance sensors 54 at the positions a to i. This implements higher-precision planarization. The number and positions of the distance sensors 54 may be optimized appropriately depending on the degree of planarity required.

According to the first embodiment, it is important but not easy to equalize the distance from the substrate surface to the surface of the fluid film 3. Although the first embodiment allows the distance from the substrate surface to the surface of the fluid film 3 to become equal by preliminarily adjusting the distance between the surface of the substrate 1 and the pressing surface of the pressing member 4 to be equal, the method requires the distance between the surface of the substrate 1 and the pressing surface of the pressing member 4 to be adjusted equal every specified period, i.e., every time the surfaces of a specified number of fluid films 3 are planarized.

By contrast, since the third embodiment allows the distance from the substrate surface to the surface of the fluid film 3 to be held constantly equal, the operation of adjusting the surface of the substrate 1 and the pressing surface of the pressing member 4 to be equal, which is performed every specified period, can be omitted.

The step of adjusting the distance between the surface of the substrate 1 and the pressing surface of the pressing member 4 to be equal may be performed before, during, or after the process of pressing the fluid film 3 by the pressing member 4.

Figure 11A:
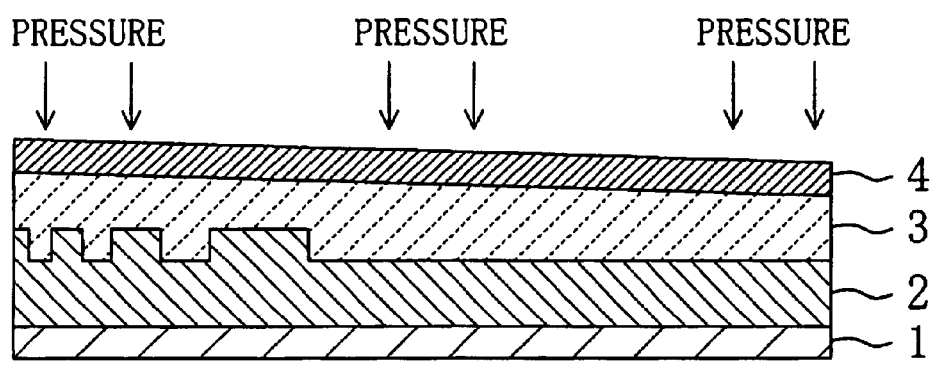
FIGS. 11(a) and 11(b) are cross-sectional views illustrating the individual process steps of the method for fabricating a semiconductor device according to the third embodiment.
Figure 11B:
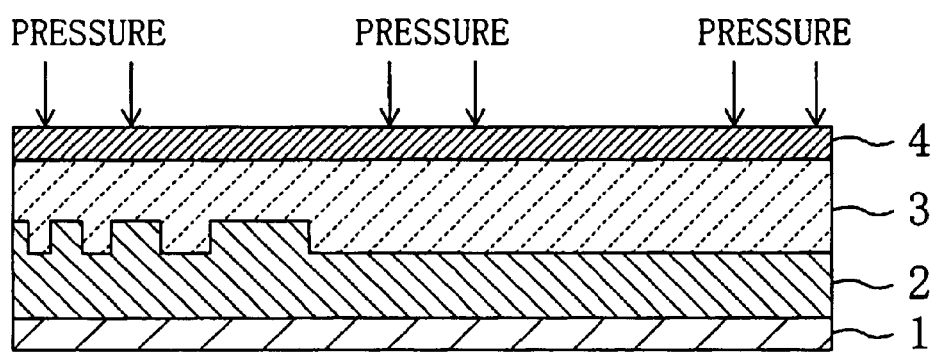

FIG. 11(a) shows the cross-sectional condition of the fluid film 3 when the distance between the pressing surface of the pressing member 4 and the surface of the substrate 1 is unequal. FIG. 11(b) shows the cross-sectional condition of the fluid film 3 when the distance between the pressing surface of the pressing member 4 and the surface of the substrate 1 is held equal.

As will be understood from a comparison between FIGS. 11(a) and 11(b), if the fluid film 3 is pressed with the distance between the pressing surface of the pressing member 4 and the surface of the substrate 1 being held equal, the surface of the fluid film 3 can be planarized with the distance from the surface of the substrate 1 to the fluid film 3 being held equal.

Embodiment 4

A method for fabricating a semiconductor device according to a fourth embodiment will be described herein below with reference to FIGS. 12A(a) and 12(b).

Figure 2A:
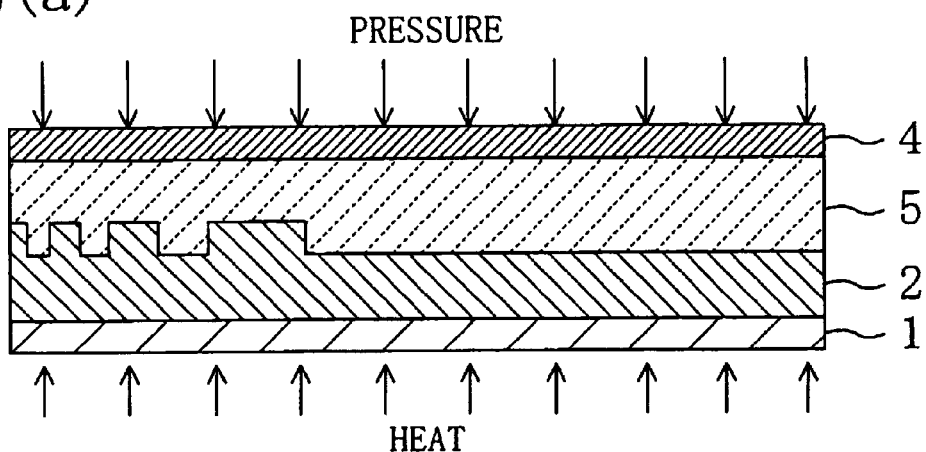
FIG. 2 is a cross-sectional views illustrating the individual process steps of the method for fabricating a semiconductor device according to the first embodiment.
Figure 2B:
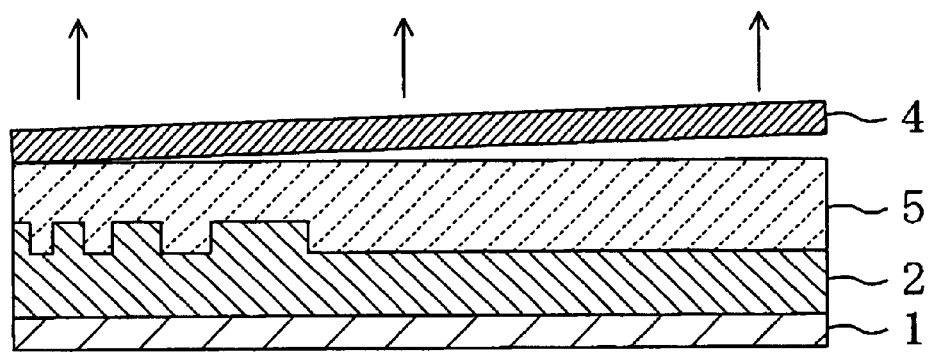
Figure 2C:
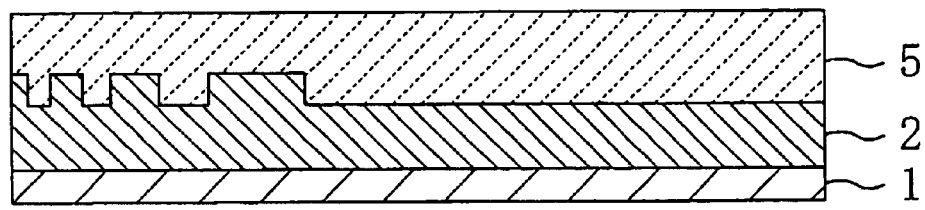

In contrast to the first embodiment which has formed the solidified film 5 with a planar surface by solidifying the fluid film 3 with the application of heat, as shown in FIG. 2(a), the fourth embodiment provides a method for forming the solidified film 5 with a planar surface by irradiating the fluid film 3 with light and thereby solidifying it.

Figure 12A:
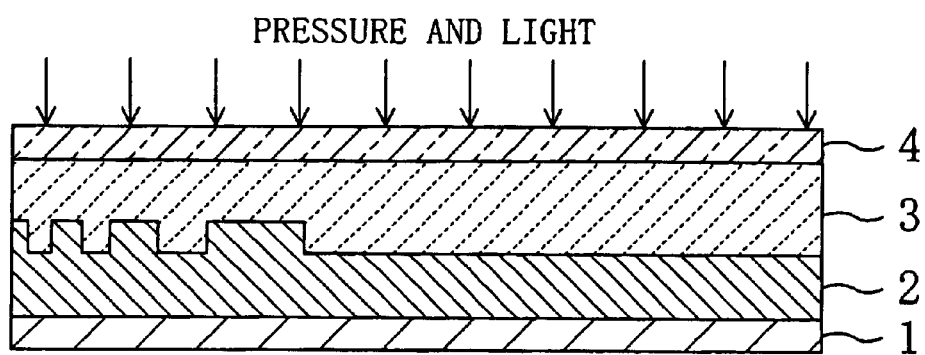
FIGS. 12(a) and 12(b) are cross-sectional views illustrating the individual process steps of a method for fabricating a semiconductor device according to a fourth embodiment.

As shown in FIG. 12(a), the fluid film 3 under a pressure applied thereto is irradiated with light with the surface thereof being planarized by pressing it against the substrate 1 by the pressing member 4 made from a light transmitting material, such as quartz. If the fluid film 3 is to be solidified by a photochemical reaction, a UV beam or a beam at a wavelength shorter than that of the UV beam is used preferably as the light for irradiation. If the fluid film 3 is to be solidified by a thermochemical reaction, an infrared beam is used preferably as the light for irrdiation. As the light, either continuous light or pulsative light may be used. If the light is intended to act only on the fluid film 3 such that the action thereof on the substrate 1 is reduced, in particular, the pulsative light is appropriate.

Figure 12B:
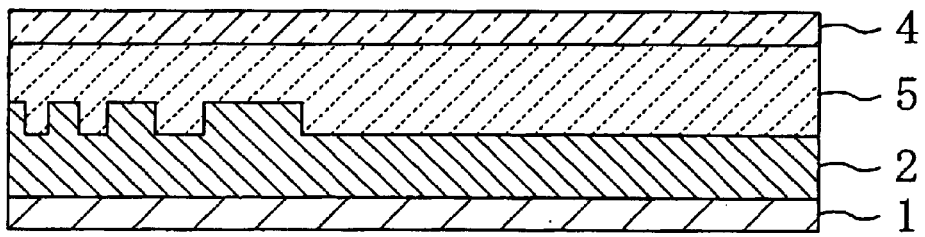

As a result, the fluid film 3 is solidified by a photochemical or thermochemical reaction so that the solidified film 5 is obtained as shown in FIG. 12(b).

The method of solidifying the fluid film 3 by a photochemical reaction is appropriate for a photoforming film, e.g., a photosensitive resin film such as a photoresist used in lithographic technology. The method of solidifying the fluid film 3 by a photothermal reaction is appropriate for an organic film, an inorganic film, and an organic/inorganic hybrid film.

Embodiment 5

A method for fabricating a semiconductor device according to a fifth embodiment will be described herein below with reference to FIGS. 13(a) and 13(b).

In contrast to the fourth embodiment which has solidified the fluid film 3 by irradiating it with light, the fifth embodiment provides a method of irradiating the fluid film 3 with light, while heating it, and thereby solidifying the fluid film 3.

Figure 13A:
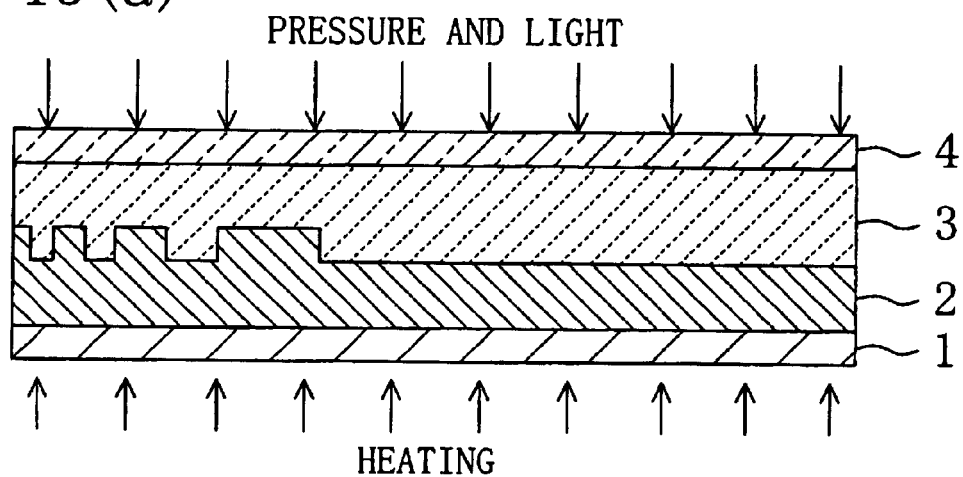
FIGS. 13(a) and 13(b) are cross-sectional views illustrating the individual process steps of a method for fabricating a semiconductor device according to a fifth embodiment.

As shown in FIG. 13(a), the fluid film 3 under a pressure applied thereto is irradiated with light, while it is heated, with the surface thereof being planarized by pressing it against the substrate 1 by the pressing member 4 made from a light transmitting material, such as quartz. In this case also, a UV beam or a beam at a wavelength shorter than that of the UV beam is used preferably as the light for irradiation if the fluid film 3 is to be solidified by a photochemical reaction and an infrared beam is used preferably as the light for irradiation if the fluid film 3 is to be solidified by a thermochemical reaction.

Figure 13B:
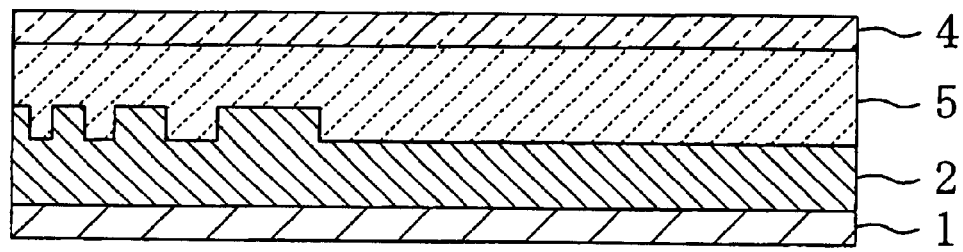

As a result, the fluid film 3 is solidified by a photochemical reaction or a thermochemical reaction so that the solidified film 5 is obtained as shown in FIG. 13(b).

The method of solidifying the fluid film 3 by a photochemical reaction is appropriate for a photoforming film, e.g., a photosensitive resin film such as a photoresist used in lithographic technology. The method of solidifying the fluid film 3 by a photothermal reaction is appropriate for an organic film, an inorganic film, and an organic/inorganic hybrid film.

Whether the step of irradiating the fluid film 3 with light or the step of heating the fluid film 3 should be performed prior to the other is determined preferably depending on the properties of the material with fluidity composing the fluid film 3.

Embodiment 6

A method for fabricating a semiconductor device according to a first example of a sixth embodiment will be described herein below with reference to FIGS. 14(a) and 14(b).

In contrast to the fourth embodiment which has solidified the fluid film 3 by irradiating it with light, the first example of the sixth embodiment provides a method of irradiating the fluid film 3 with light, while cooling it from the substrate side.

Figure 14A:
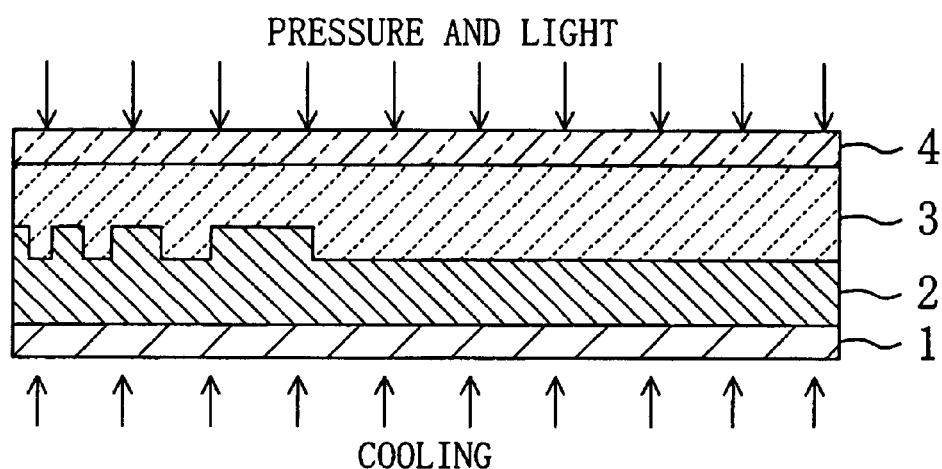
FIGS. 14(a) and 14(b) are cross-sectional views illustrating the individual process steps of a method for fabricating a semiconductor device according to a first example of a sixth embodiment.

As shown in FIG. 14(a), the fluid film 3 under a pressure applied thereto has a surface thereof irradiated with light, while it is cooled from the substrate side, with the surface thereof being planarized by pressing it against the substrate 1 by the pressing member 4 made from a light transmitting material, such as quartz. In this case also, a UV beam or a beam at a wavelength shorter than that of the UV beam is used preferably as the light for irradiation if the fluid film 3 is to be solidified by s photochemical reaction and an infrared beam is used preferably as the light for irradiation if the fluid film 3 is to be solidified by a thermochemical reaction.

Figure 14B:
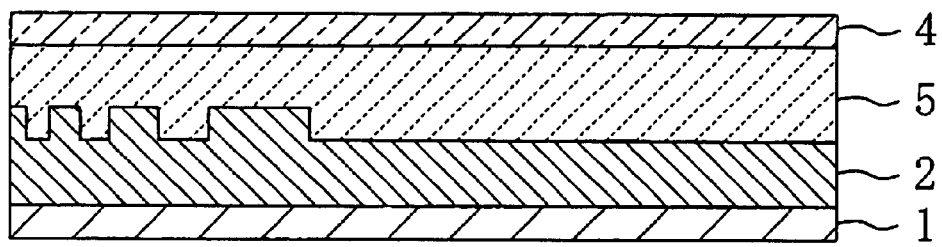

As a result, the fluid film 3 is solidified by a photochemical reaction or a thermochemical reaction, though it is cooled from the substrate side, so that the solidified film 5 is obtained as shown in FIG. 14(b).

The first example of the sixth embodiment is suitable for the case where the fluid film 3 readily flows under a pressure. The first example suppresses the flowing of the fluid film 3 and allows the fluid film 3 to be solidified by irradiating the fluid film 3 with light, while cooling it from the substrate side.

A method for fabricating a semiconductor device according to a second example of the sixth embodiment will be described herein below with reference to FIGS. 15(a) and 15(c).

In contrast to the first example which has solidified the fluid film 3 by irradiating with light, while cooling it from the substrate side, the second example provides a method of temporarily solidifying the fluid film 3 by cooling it and then irradiating the fluid film 3 with light.

Figure 15A:
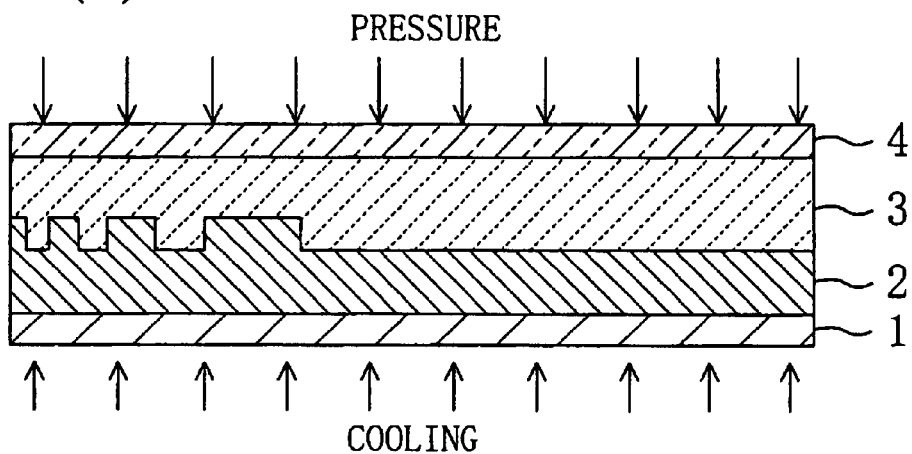
FIGS. 15(a) and 15(c) are cross-sectional views illustrating the individual process steps of a method for fabricating a semiconductor device according to a second example of the sixth embodiment.

First, as shown in FIG. 15(a), the fluid film 3 has the surface thereof planarized by pressing it against the substrate 1 by the pressing member 4 made from a light transmitting material, such as quartz, and is temporarily solidified under a pressure applied thereto by cooling it from the substrate side.

Figure 15B:
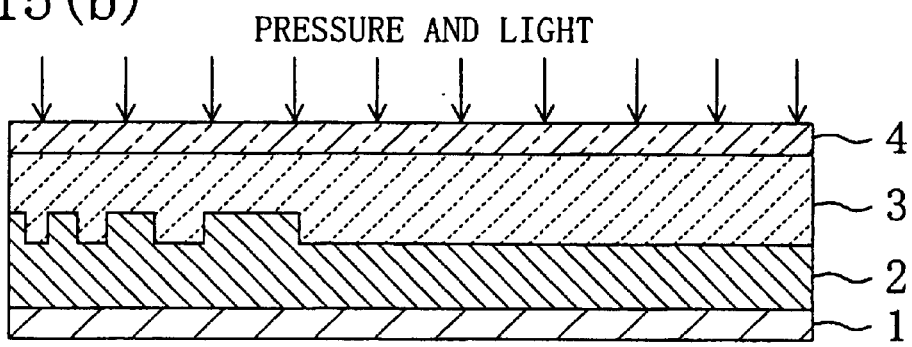

Then, as shown in FIG. 15(b), the fluid film 3 is irradiated with light after the cooling of the fluid film 3 is stopped, while the pressure is applied continuously to the fluid film 3. In this case also, a UV beam or a beam at a wavelength shorter than that of the UV beam is used preferably as the light for irradiation if the fluid film 3 is to be solidified by a photochemical reaction and an infrared beam is used preferably as the light for irradiation if the fluid film 3 is to be solidified by a thermochemical reaction. In the case of using the thermochemical reaction, rapid thermal annealing (RTA) for rapidly heating the fluid film 3 is performed preferably.

Figure 15C:
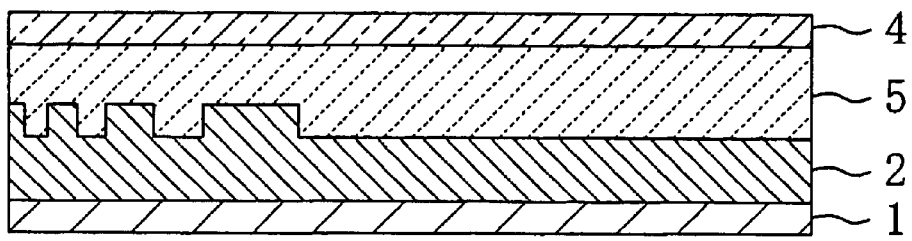

As a result, the fluid film 3 is solidified by a photochemical or thermochemical reaction so that the solidified film 5 is obtained as shown in FIG. 15(c).

The second example is suitable for the case where the fluid film 3 flows even under a low pressure. The second example suppresses the flowing of the fluid film 3 and allows the fluid film 3 to be solidified by cooling the fluid film 3 from the substrate side such that it is temporarily solidified and then irradiating the fluid film 3 with light.

Since the second example provides the method of solidifying the fluid film 3 by temporarily solidifying the fluid film 3 and then irradiating it with light, irradiation with light can be performed after removing the pressing member 4 so that the pressing member 4 need not be transparent.

It will easily be appreciated that heating performed in each of the first, fourth, and fifth embodiments and the first example of the sixth embodiment may also be performed by rapid thermal annealing in the same manner as in the second example of the sixth embodiment.

Embodiment 7

A method for fabricating a semiconductor device according to a seventh embodiment will be described herein below with reference to FIGS. 16(a) and 16(b).

The seventh embodiment provides a method for thinning the solidified film obtained according to the first embodiment.

Figure 16A:
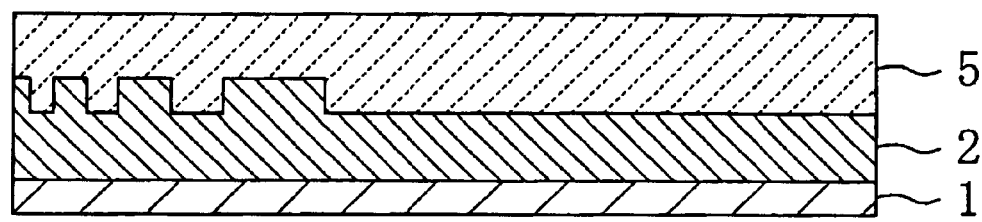
FIGS. 16(a) and 16(b) are cross-sectional views illustrating the individual process steps of a method for fabricating a semiconductor device according to a seventh embodiment.
Figure 16B:
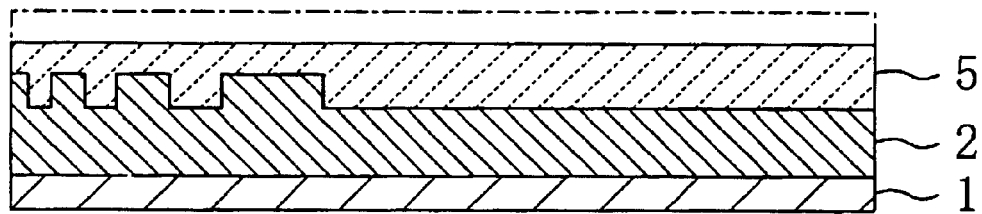

As shown in FIG. 16(a), the solidified film 5 with a planar surface is formed in the same manner as in the first embodiment. Then, plasma etching or chemical mechanical polishing (CMP) is performed with respect to the solidified film 5, thereby removing the surface portion of the solidified film 5 and thinning the solidified film 5, as shown in FIG. 16(b).

In the case of using plasma etching, a gas containing fluorine such as a $CF_4$ gas or $CHF_3$ gas, a gas mixture of a gas containing fluorine and an oxygen gas, or an ammonia gas may be used as an etching gas and film thickness adjustment excellent in uniformity can be performed.

Since the seventh embodiment forms the solidified film 5 having a thickness larger than a desired value and then adjusts the thickness of the solidified film 5 to a specified value by a thinning process, a more stable process with a wide process window can be provided.

Embodiment 8

A method for fabricating a semiconductor device according to an eighth embodiment will be described herein below with reference to FIGS. 17(a) to 17(c), FIGS. 18(a) to 18(d), and FIGS. 19(a) to 19(d).

Figure 17A:
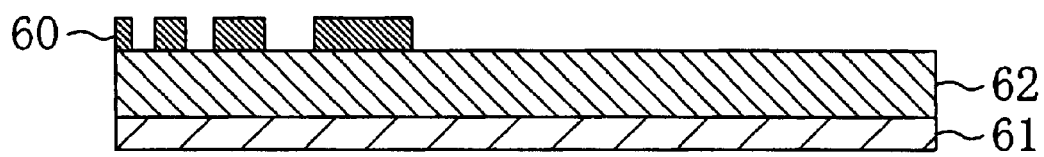
FIGS. 17(a) to 17(c) are cross-sectional views illustrating the individual process steps of a method for fabricating a semiconductor device according to an eighth embodiment.

First, as shown in FIG. 17(a), a lower interlayer insulating film 62 is formed on a semiconductor substrate 61. Then, plugs are formed in the lower interlayer insulating film 62, though they are not depicted, and a metal interconnect 60 is formed on the lower interlayer insulating film 62.

Figure 17B:
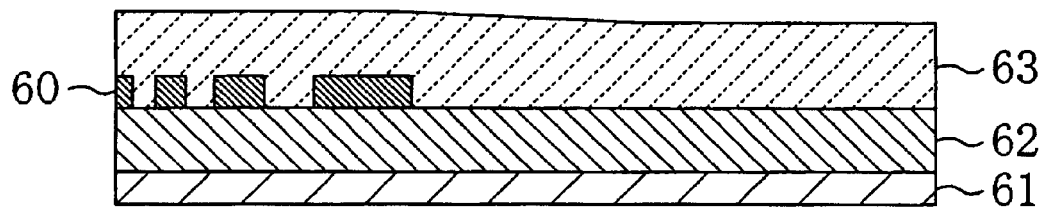

Next, as shown in FIG. 17(b), an insulating material with fluidity in the state of a liquid or gel is supplied to the entire surface of a semiconductor substrate 61 by a spin coating method, a microscopic spraying method, or a rotating roller method in the same manner as in the first embodiment, thereby forming a fluid insulating film 63. The thickness of the fluid insulating film 63 may be set to an appropriate value.

As the fluid insulating film 63, an insulating film as described in the first embodiment, i.e., an organic film, an inorganic film, an organic/inorganic hybrid film, a porous film, or the like can be used. Since an insulating film having a compact texture and a dielectric constant lower than that of a normal silicon oxide film can be obtained, a film suitable for use in a semiconductor device having a feature size of 100 nm or less through miniaturization can be implemented. In particular, the use of a porous film allows an insulating film having an extremely low dielectric constant of 2 or less to be formed.

Figure 17C:
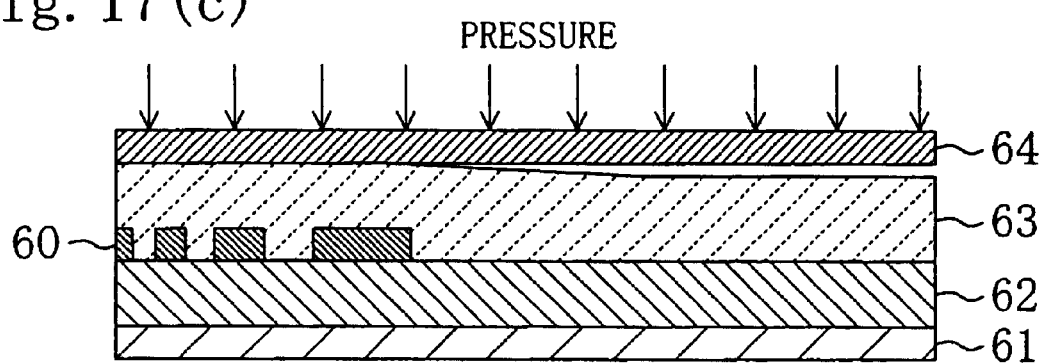
Figure 18A:
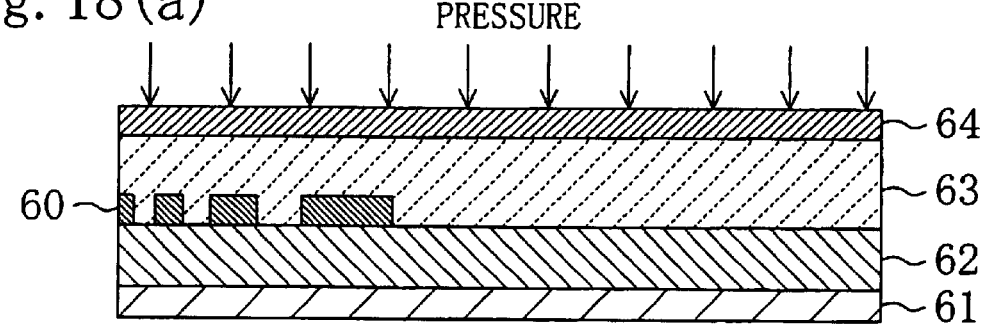
FIGS. 18(a) to 18(d) are cross-sectional views illustrating the individual process steps of the method for fabricating a semiconductor device according to the eighth embodiment.

Next, as shown in FIG. 17(c), a pressing member 64 having a planar pressing surface is brought into contact with the surface of the fluid insulating film 63. Then, as shown in FIG. 18(a), a pressure is applied to the pressing member 64 to planarize the surface of the fluid insulating film 63. In other words, the height of the fluid insulating film 63 from the surface of the semiconductor substrate 61 is entirely equalized.

Figure 18B:
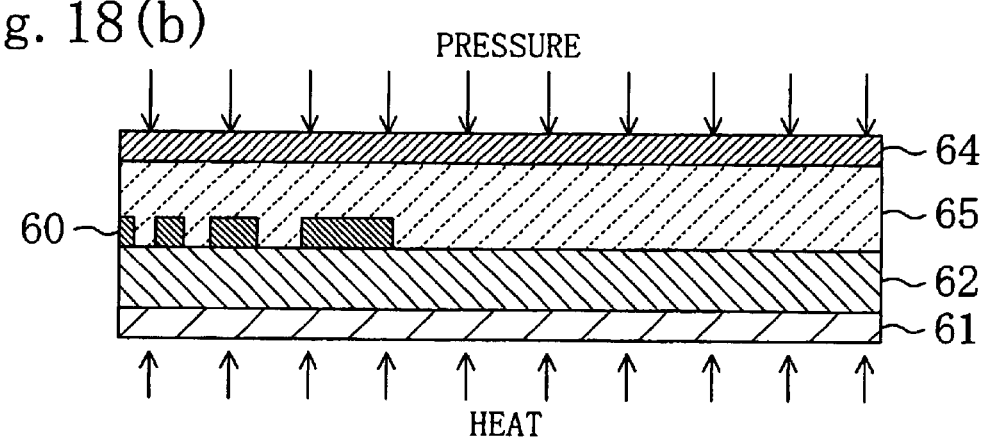

Next, as shown in FIG. 18(b), the semiconductor substrate 61 including the fluid insulating film 63 is heated such that a thermochemical reaction occurs in the insulating material to solidify the fluid insulating film 63 and thereby form a planarized upper interlayer insulating film 65.

Figure 18C:
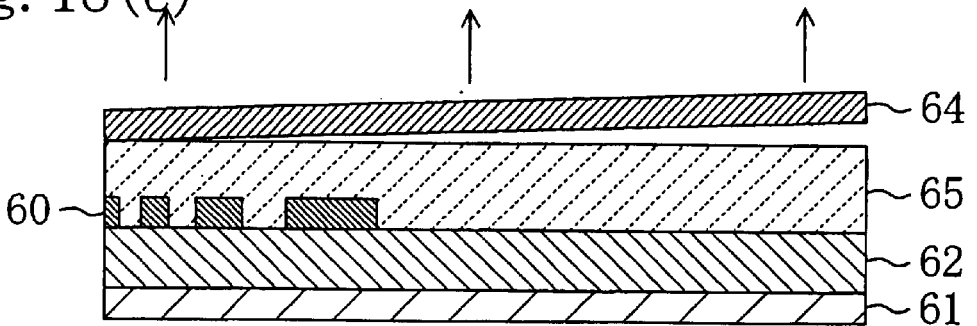
Figure 18D:
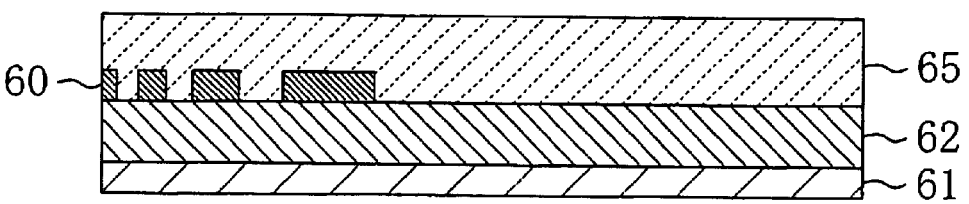

After heating is stopped and the temperature of the semiconductor substrate 61 is lowered to a room temperature, the pressing member 64 is removed from the upper interlayer insulating film 65, as shown in FIG. 18(c), so that the planarized upper interlayer insulating film 65 is exposed, as shown in FIG. 18(d).

Figure 19A:
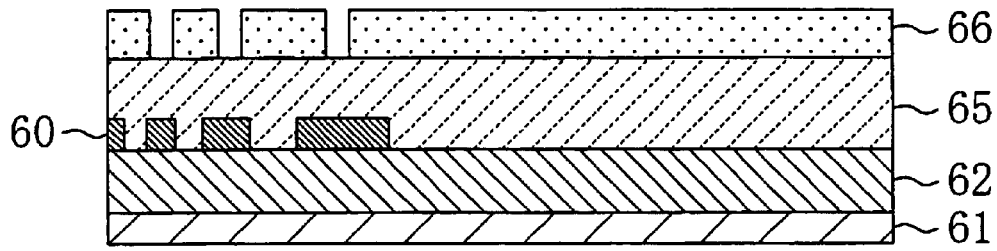
FIGS. 19(a) to 19(d) are cross-sectional views illustrating the individual process steps of the method for fabricating a semiconductor device according to the eighth embodiment.
Figure 19B:
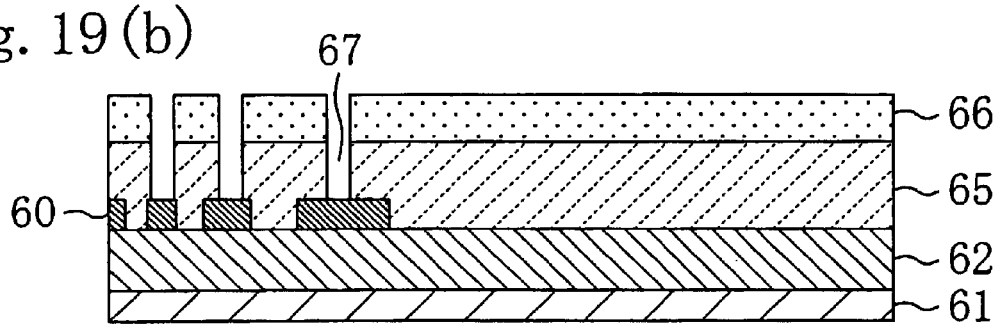
Figure 19C:
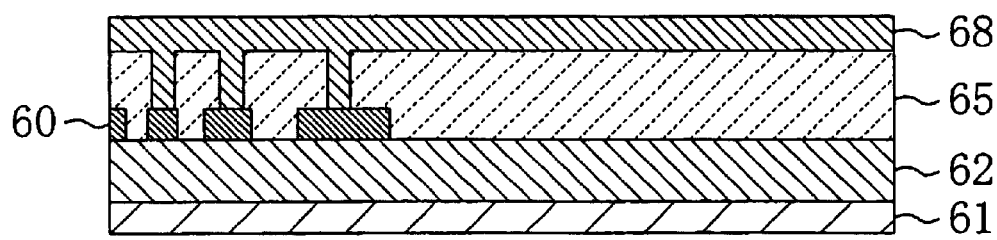
Figure 19D:
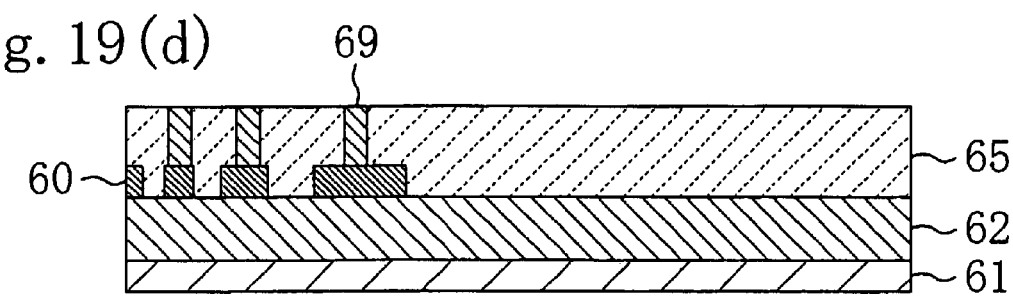
Figure 20A:
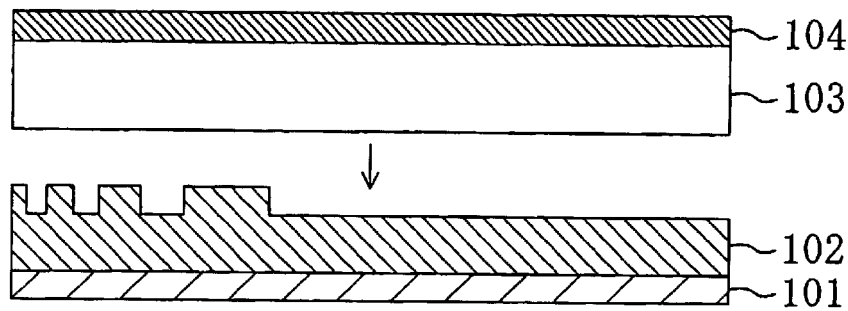
FIGS. 20(a) to 20(d) are cross-sectional views illustrating the individual process steps of the conventional method for fabricating a semiconductor device.
Figure 20B:
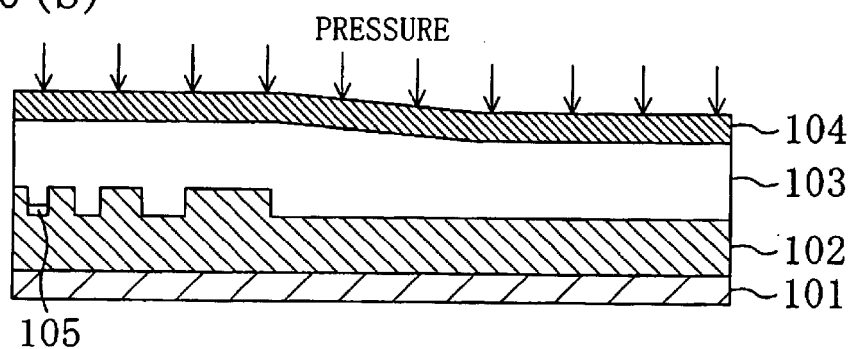
Figure 20C:
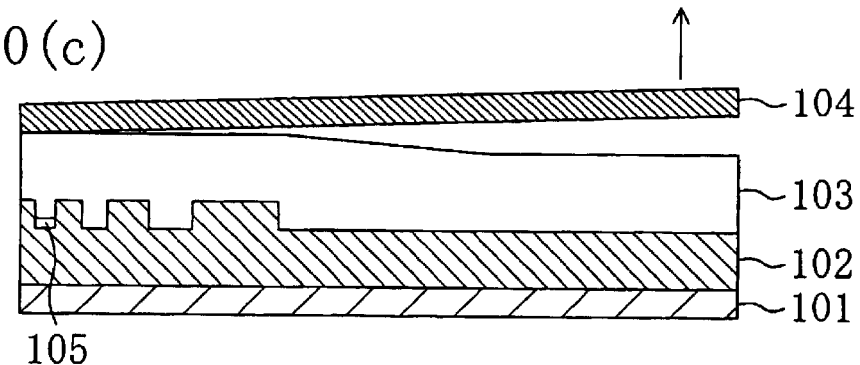
Figure 20D:
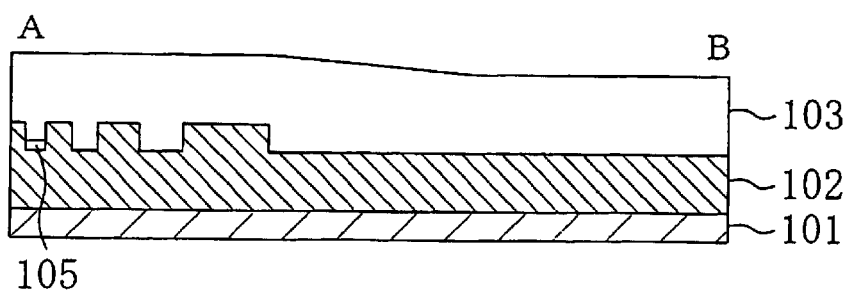

Next, as shown in FIG. 19(a), a mask pattern 66 composed of a resist pattern or a hard mask and having openings is formed on the upper interlayer insulating film 65 by using well-known lithographic technology. Then, dry etching is performed with respect to the upper interlayer insulating film 65 by using the mask pattern 66 as a mask, thereby forming openings 67 for plugs in the upper interlayer insulating film 65, as shown in FIG. 19(b).

After the mask pattern 66 is removed, a metal film 68 is deposited over the entire surface of the upper interlayer insulating film 65 such that the openings 67 for plugs are filled therewith. Then, an unneeded portion of the metal film 68 located on the upper interlayer insulating film 65 is removed by CMP so that connection plugs 69 composed of the metal film 68 are formed.

Instead of the openings 67 for plugs, grooves for interconnection may also be formed in the upper interlayer insulating film 65. In the arrangement, a buried interconnect is formed in the upper interlayer insulating film 65 in place of the connection plugs 69.

If the individual process steps described above are repeatedly performed, a multilayer interconnection structure having the planar upper interlayer insulating films 65 in the individual layers can be formed, though it is not depicted.

According to the eighth embodiment, the upper interlayer insulating film 65 without a global step can be formed so that a reduction in focal depth margin resulting from a step can be suppressed in the step of forming a mask pattern on the upper interlayer insulating film 65 by lithographic technology. This achieves a significant increase in processing margin (process window), compared with the prior art technology, so that a high-precision semiconductor device is fabricated.

It will easily be appreciated that the present invention is also applicable to a dual damascene method for forming a connection plug and a buried interconnect simultaneously.

INDUSTRIAL APPLICABILITY

In accordance with a first method for fabricating a semiconductor device, there can be implemented a film in which a global step does not occur, a depressed portion with a high aspect ratio is filled completely, and no unburied portion is formed.

In accordance with a second method for fabricating a semiconductor device, an insulating film without a global step can be formed so that a reduction in focal depth margin resulting from a step is suppressed in the step of forming a mask pattern on an insulating film by lithographic technology. This achieves a significant increase in processing margin (process window), compared with the prior art technology, so that a high-precision semiconductor device is fabricated.

What is claimed is:

1. A method for fabricating a semiconductor device, the method comprising:
   a film forming step of supplying, while moving a nozzle having fine outlets and a substrate relative to each other in an in-plane direction, a material with fluidity from the outlets to a surface of the substrate to form a film with fluidity;
   a planarizing step of pressing the film with fluidity against the substrate by a planar pressing surface of a pressing member to planarize a surface of the film with fluidity; and
   a solidifying step of solidifying the film with fluidity having the surface planarized.

2. A method for fabricating a semiconductor device, the method comprising:
   a film forming step of supplying, while rotating a roller, a material with fluidity adhered to a surface of the roller to a surface of a substrate to form a film with fluidity;
   a planarizing step of pressing the film with fluidity against the substrate by a planar pressing surface of a pressing member to planarize a surface of the film with fluidity; and
   a solidifying step of solidifying the film with fluidity having the surface planarized.

3. The method of claim 1 or 2, wherein the pressing surface of the pressing member has a hydrophobic property.

4. The method of claim 1 or 2, wherein the material with fluidity is an insulating material.

5. The method of claim 1 or 2, wherein the material with fluidity is in the state of a liquid or a gel.

6. The method of claim 1 or 2, further comprising, after the film forming step, the step of:
   selectively removing a peripheral portion of the film with fluidity.

7. The method of claim 6, wherein the step of removing the peripheral portion of the film with fluidity is performed by supplying a solution for dissolving the material with fluidity to the peripheral portion of the film with fluidity, while rotating the substrate.

8. The method of claim 6, wherein the step of removing the peripheral portion of the film with fluidity is performed by irradiating the peripheral portion of the film with fluidity with light to modify the peripheral portion and removing the modified peripheral portion.

9. The method of claim 1 or 2, wherein the planarizing step includes the step of measuring a plurality of distances between the surface of the substrate and the pressing surface and pressing the film with fluidity by the pressing surface such that the plurality of distances become equal.

10. The method of claim 1 or 2, wherein the planarizing step includes the step of measuring a plurality of distances between a surface of a stage on which the substrate is placed and the pressing surface and pressing the film with fluidity by the pressing surface such that the plurality of distances become equal.

11. The method of claim 1 or 2, wherein the solidifying step is performed by heating the film with fluidity, while pressing the film with fluidity by the pressing surface in the planarizing step.

12. The method of claim 1 or 2, further comprising, after the solidifying step, the step of:
   thinning the entire film with fluidity.

13. The method of claim 12, wherein the step of thinning the entire film with fluidity is performed by plasma etching.

14. The method of claim 12, wherein the step of thinning the film with fluidity is performed by chemical mechanical polishing.

15. A method for fabricating a semiconductor device, the method comprising:
   a film forming step of supplying a material with fluidity to a surface of a substrate to form a film with fluidity;
   a planarizing step of pressing the film with fluidity against the substrate by a planar pressing surface of a pressing member to planarize a surface of the film with fluidity; and
   a solidifying step of solidifying the film with fluidity having the surface planarized,
   the planarizing step including the step of measuring a plurality of distances between a surface of a stage on which the substrate is placed and the pressing surface and pressing the film with fluidity by the pressing surface such that the plurality of distances become equal,
   the step of measuring the plurality of distances being performed by measuring an electrostatic capacitance per unit area at a position at which the measurement is performed.

16. A method for fabricating a semiconductor device, the method comprising:

a film forming step of supplying a material with fluidity to a surface of a substrate to form a film with fluidity;

a planarizing step of pressing the film with fluidity against the substrate by a planar pressing surface of a pressing member to planarize a surface of the film with fluidity; and a solidifying step of solidifying the film with fluidity having the surface planarized, the solidifying step being performed by irradiating the film with fluidity with light, while pressing the film with fluidity by the pressing surface in the planarizing step.

17. The method of claim 16, wherein the step of irradiating the film with fluidity with light is performed while cooling the film with fluidity or after temporarily solidifying the film with fluidity by cooling.

18. A method for fabricating a semiconductor device, the method comprising:

a film forming step of supplying a material with fluidity to a surface of a substrate to form a film with fluidity;

a planarizing step of pressing the film with fluidity against the substrate by a planar pressing surface of a pressing member to planarize a surface of the film with fluidity; and a solidifying step of solidifying the film with fluidity having the surface planarized, the solidifying step being performed by irradiating the film with fluidity with light and heating the film with fluidity, while pressing the film with fluidity by the pressing surface in the planarizing step.

19. A method for fabricating a semiconductor device, the method comprising the steps of:

supplying, while moving a nozzle having fine outlets and a substrate relative to each other in an in-plane direction, an insulating material with fluidity from the outlets to a surface of the substrate to form an insulating film with fluidity;

pressing the insulating film with fluidity against the substrate by a planar pressing surface of a pressing member to planarize a surface of the insulating film with fluidity;

solidifying the insulating film with fluidity having the surface planarized;

performing selective etching with respect to the solidified insulating film to form a depressed portion in the solidified insulating film; and burying a metal material in the depressed portion to form a buried interconnect or plug.

20. A method for fabricating a semiconductor device, the method comprising:

the step of supplying, while rotating a roller, an insulating material with fluidity adhered to a surface of the roller to a surface of a substrate to form an insulating film with fluidity;

a planarizing step of pressing the insulating film with fluidity against the substrate by a planar pressing surface of a pressing member to planarize a surface of the insulating film with fluidity;

a solidifying step of solidifying the insulating film with fluidity having the surface planarized;

the step of performing selective etching with respect to the solidified insulating film to form a depressed portion in the solidified insulating film; and the step of burying a metal material in the depressed portion to form a buried interconnect or plug.

21. The method of claim 19 or 20, wherein the insulating film is an organic film, an inorganic film, an organic/inorganic hybrid film, a photoforming film, a photosensitive resin film, or a porous film.

22. The method of claim 19 or 20, wherein a relative dielectric constant of the insulating film is approximately 4 or less.

23. A method for fabricating a semiconductor device, the method comprising:

an insulating film forming step of supplying an insulating material with fluidity to a surface of a substrate to form an insulating film with fluidity;

a planarizing step of pressing the insulating film with fluidity against the substrate by a planar pressing surface of a pressing member to planarize a surface of the insulating film with fluidity;

a solidifying step of solidifying the insulating film with fluidity having the surface planarized;

a step of performing selective etching with respect to the solidified insulating film to form a depressed portion in the solidified insulating film; and a step of burying a metal material in the depressed portion to form a buried interconnect or plug, wherein:

the planarizing step includes a sub-step of measuring a plurality of distance between a surface of a stage on which the substrate is placed and the pressing surface, and pressing the insulating film with fluidity by the pressing surface such that the plurality of distance become equal, and the sub-step of measuring the plurality of distance is performed by measuring an electrostatic capacitance per unit area at a position at which the measurement is performed.

24. A method for fabricating a solid film, the method comprising:

a film forming step of supplying, while moving a nozzle having fine outlets and a substrate relative to each other in an in-plane direction, a material with fluidity from the outlets to a surface of the substrate to form a film with fluidity;

a planarizing step of pressing the film with fluidity against the substrate by a planar pressing surface of a pressing member to planarize a surface of the film with fluidity; and a solidifying step of solidifying the film with fluidity having the surface planarized.

25. A method for fabricating a solid film, the method comprising:

a film forming step of supplying, while rotating a roller, a material with fluidity adhered to a surface of the roller to a surface of a substrate to form a film with fluidity;

a planarizing step of pressing the film with fluidity against the substrate by a planar pressing surface of a pressing member to planarize a surface of the film with fluidity; and a solidifying step of solidifying the film with fluidity having the surface planarized.

26. A method for fabricating a semiconductor device, the method comprising:

supplying an insulating material with fluidity to a surface of a substrate to form an insulating film with fluidity;

pressing the insulating film with fluidity against the substrate by a planar pressing surface of a pressing member to planarize a surface of the insulating film with fluidity;

solidifying the insulating film with fluidity having the surface planarized;

performing selective etching with respect to the solidified insulating film to form a depressed portion in the solidified insulating film; and burying a metal material in the depressed portion to form a buried interconnect or plug.

27. A method for fabricating a semiconductor device, the method comprising:

a film forming step of supplying a material with fluidity to a surface of a substrate to form a film with fluidity;

a planarizing step of pressing the film with fluidity against the substrate by a planar pressing surface of a pressing member to planarize a surface of the film with fluidity; and a solidifying step of solidifying the film with fluidity having the surface planarized, wherein the material with fluidity is an insulating material including a Si—O bond.

28. The method of claim 27, wherein the insulating material is including siloxane.

29. The method of claim 27, wherein the pressing surface of the pressing member has a hydrophobic property.

30. The method of claim 27, wherein the material with fluidity is in the state of a liquid or a gel.

31. The method of claim 27, further comprising, after the film forming step, the step of selectively removing a peripheral portion of the film with fluidity.

32. The method of claim 31, wherein the step of removing the peripheral portion of the film with fluidity is performed by supplying a solution for dissolving the material with fluidity to the peripheral portion of the film with fluidity, while rotating the substrate.

33. The method of claim 31, wherein the step of removing the peripheral portion of the film with fluidity is performed by irradiating the peripheral portion of the film with fluidity with light to modify the peripheral portion and removing the modified peripheral portion.

34. The method of claim 27, wherein the planarizing step includes the step of measuring a plurality of distances between the surface of the substrate and the pressing surface and pressing the film with fluidity by the pressing surface such that the plurality of distances become equal.

35. The method of claim 27, wherein the planarizing step includes the step of measuring a plurality of distances between a surface of a stage on which the substrate is placed and the pressing surface and pressing the film with fluidity by the pressing surface such that the plurality of distances become equal.

36. The method of claim 27, wherein the solidifying step is performed by heating the film with fluidity, while pressing the film with fluidity by the pressing surface in the planarizing step.

37. The method of claim 27, further comprising, after the solidifying step, the step of thinning the film with fluidity.

38. The method of claim 37, wherein the step of thinning the film with fluidity is performed by plasma etching.

39. The method of claim 37, wherein the step of thinning the film with fluidity is performed by chemical mechanical polishing.

40. A method for fabricating a semiconductor device, the method comprising:

a film forming step of supplying a material with fluidity to a surface of a substrate to form a film with fluidity;

a planarizing step of pressing the film with fluidity against the substrate by a planar pressing surface of a pressing member to planarize a surface of the film with fluidity; and a solidifying step of solidifying the film with fluidity having the surface planarized, wherein the material with fluidity is including a conductive material, and the solidified film is a metal film.

41. The method of claim 40, wherein the pressing surface of the pressing member has a hydrophobic property.

42. The method of claim 40, wherein the material with fluidity is in the state of a liquid or a gel.

43. The method of claim 40, further comprising, after the film forming step, the step of selectively removing a peripheral portion of the film with fluidity.

44. The method of claim 43, wherein the step of removing the peripheral portion of the film with fluidity is performed by supplying a solution for dissolving the material with fluidity to the peripheral portion of the film with fluidity, while rotating the substrate.

45. The method of claim 40, wherein the planarizing step includes the step of measuring a plurality of distances between the surface of the substrate and the pressing surface and pressing the film with fluidity by the pressing surface such that the plurality of distances become equal.

46. The method of claim 40, wherein the planarizing step includes the step of measuring a plurality of distances between a surface of a stage on which the substrate is placed and the pressing surface and pressing the film with fluidity by the pressing surface such that the plurality of distances become equal.

47. The method of claim 40, wherein the solidifying step is performed by heating the film with fluidity, while pressing the film with fluidity by the pressing surface in the planarizing step.

48. The method of claim 40, further comprising, after the soldifying step, the step of thinning the film with fluidity.

49. The method of claim 48, wherein the step of thinning the film with fluidity is performed by plasma etching.

50. The method of claim 48, wherein the step of thinning the film with fluidity is performed by chemical mechanical polishing.

* * * * *